United States Patent [19]
Parekh

[11] Patent Number: 6,140,172
[45] Date of Patent: Oct. 31, 2000

[54] CONDUCTIVE ELECTRICAL CONTACTS, CAPACITORS, DRAMS, AND INTEGRATED CIRCUITRY, AND METHODS OF FORMING CONDUCTIVE ELECTRICAL CONTACTS, CAPACITORS, DRAMS AND INTEGRATED CIRCUITRY

[75] Inventor: Kunal R. Parekh, Boise, Id.

[73] Assignee: Micron Technology, Inc., Boise, Id.

[21] Appl. No.: 09/204,749

[22] Filed: Dec. 2, 1998

Related U.S. Application Data

[62] Division of application No. 08/798,251, Feb. 11, 1997.

[51] Int. Cl.$^7$ .................................................. H01L 21/8234
[52] U.S. Cl. ........................ 438/238; 438/156; 438/310; 438/586; 437/52; 437/60
[58] Field of Search ...................................... 438/238, 310, 438/586, 156; 437/52, 60

[56] References Cited

U.S. PATENT DOCUMENTS

| | | | |
|---|---|---|---|
| 4,845,537 | 7/1989 | Nishimura et al. | 257/302 |
| 4,864,374 | 9/1989 | Banerjee | 257/302 |
| 5,084,416 | 1/1992 | Ozaki et al. | 438/197 |
| 5,170,233 | 12/1992 | Liu et al. | 257/308 |
| 5,180,689 | 1/1993 | Liu et al. | 438/640 |
| 5,206,183 | 4/1993 | Dennison | 437/47 |
| 5,227,325 | 7/1993 | Gonzalez | 437/52 |
| 5,229,310 | 7/1993 | Sivan | 437/41 TFT |
| 5,229,326 | 7/1993 | Dennison et al. | 437/195 |
| 5,244,826 | 9/1993 | Gonzalez et al. | 437/60 |
| 5,270,968 | 12/1993 | Kim et al. | 437/41 TFT |
| 5,283,455 | 2/1994 | Inoue et al. | 257/329 |
| 5,294,296 | 3/1994 | Yoon et al. | 156/657 |
| 5,323,038 | 6/1994 | Gonzalez et al. | 257/308 |
| 5,334,862 | 8/1994 | Manning et al. | 437/40 TFT |
| 5,338,700 | 8/1994 | Dennison et al. | 437/60 |

(List continued on next page.)

OTHER PUBLICATIONS

Sakao, M., "A Capacitor–Over–Bit–Line (COB) Cell With a Hemispherical–Grain Storage Node For 64Mb DRAMs", 1990 IEEE, pp. 27.3.1—27.3.4.

Aoki, M., et. al., "Fully Self–Aligned 6F$^2$ Cell Technology For Low Cost 1Gb DRAM", 1996 IEEE, pp. 22–23.

IBM Technical Disclosure Bulletin, "Methods of Forming Small Contact Holes", vol. 30, No. 8 (Jan. 1988), pp. 252–253.

Hayden, J.D., et al., "A New Toroidal TFT Structure For Future Generation SRAMs", IEEE 1993, pp. 825–828, IEDM.

*Primary Examiner*—Richard Elms
*Assistant Examiner*—Pho Luu
*Attorney, Agent, or Firm*—Wells, St. John, Roberts, Gregory & Matkin P.S.

[57] ABSTRACT

The invention encompasses DRAM constructions, capacitor constructions, conductive contacts, integrated circuitry, methods of forming DRAM constructions, and methods of forming capacitor constructions. The invention includes a method of forming a contact to a node location comprising: a) forming an electrically insulative layer over a node location; b) patterning a masking layer over a portion of the insulative layer to form an unmasked portion and a masked portion of the insulative layer; c) removing parts of the masked and unmasked portions of the insulative layer to form a first opening over the node location which underlies a portion of the masking layer; d) forming an etch restriction layer within the first opening and over the masking layer; e) forming a sacrificial spacer layer within the first opening and over the etch restriction layer; f) forming a second opening extending from the first opening to the node location; and g) forming an electrically conductive pedestal within the first and second openings and in electrical connection with the node location. The invention also includes a capacitor comprising: a) an electrically conductive pedestal in electrical contact with a node location, the pedestal, viewed laterally in cross-section, comprising a pair of opposing lateral surfaces; b) an inner electrically conductive layer laterally against both lateral surfaces; c) a capacitor dielectric layer laterally against the inner conductive layer; and d) an outer electrically conductive layer laterally against the capacitor dielectric layer.

22 Claims, 22 Drawing Sheets

U.S. PATENT DOCUMENTS

| | | | |
|---|---|---|---|
| 5,385,858 | 1/1995 | Manabe | 437/52 |
| 5,401,681 | 3/1995 | Dennison | 437/60 |
| 5,444,013 | 8/1995 | Akram et al. | 437/60 |
| 5,451,537 | 9/1995 | Tseng et al. | 437/52 |
| 5,482,886 | 1/1996 | Park et al. | 438/397 |
| 5,516,710 | 5/1996 | Boyd et al. | 437/31 |
| 5,527,738 | 6/1996 | Koh et al. | 437/195 |
| 5,545,584 | 8/1996 | Wuu et al. | 438/238 |
| 5,622,883 | 4/1997 | Kim | 438/396 |
| 5,623,243 | 4/1997 | Watanabe et al. | 257/309 |
| 5,629,539 | 5/1997 | Aoki et al. | 257/306 |
| 5,661,064 | 8/1997 | Figura et al. | 438/396 |
| 5,700,731 | 12/1997 | Lin et al. | 438/381 |
| 5,712,202 | 1/1998 | Liaw et al. | 438/253 |
| 5,792,687 | 8/1998 | Jeng et al. | 438/253 |
| 5,796,573 | 8/1998 | Kotecki et al. | 257/303 |
| 5,874,756 | 2/1999 | Ema et al. | 257/296 |

CONDUCTIVE ELECTRICAL CONTACTS, CAPACITORS, DRAMS, AND INTEGRATED CIRCUITRY, AND METHODS OF FORMING CONDUCTIVE ELECTRICAL CONTACTS, CAPACITORS, DRAMS AND INTEGRATED CIRCUITRY

RELATED PATENT DATA

This patent resulted from a divisional application of U.S. patent application Ser. No. 08/798,251, which was filed on Feb. 11, 1997 now pending.

TECHNICAL FIELD

The invention pertains to semiconductor capacitor constructions and to methods of forming semiconductor capacitor constructions. The invention also pertains to semiconductor conductive contact constructions and to methods of forming semiconductor conductive contacts. The invention is thought to have particular significance in application to methods of forming dynamic random access memory (DRAM) cell structures, to DRAM cell structures, and to integrated circuitry incorporating DRAM cell structures.

BACKGROUND OF THE INVENTION

A commonly used semiconductor memory device is a DRAM cell. A DRAM cell generally consists of a capacitor coupled through a transistor to a bitline. A continuous challenge in the semiconductor industry is to increase DRAM circuit density. Accordingly, there is a continuous effort to decrease the size of memory cell components. A limitation on the minimal size of cell components is impacted by the resolution of a photolithographic etch during fabrication of the cell components. Although this resolution is generally improving, at any given time there is a minimum photolithographic feature dimension of which a given fabrication process is capable. It would be desirable to form DRAM components having at least some portion with a cross-sectional dimension of less than a given minimum capable photolithographic feature dimension.

Another continuous trend in the semiconductor industry is to minimize processing steps. Accordingly, it is desirable to utilize common steps for the formation of separate DRAM components. For instance, it is desirable to utilize common steps for the formation of DRAM capacitor structures and DRAM bitline contacts.

A semiconductor wafer fragment 10 is illustrated in FIG. 1 showing a prior art DRAM array 83. Wafer fragment 10 comprises a semiconductive material 12, field oxide regions 14, and wordlines 24 and 26. Wordlines 24 and 26 comprise a gate oxide layer 16, a polysilicon layer 18, a silicide layer 20 and a silicon oxide layer 22. Silicide layer 20 comprises a refractory metal silicide, such as tungsten silicide, and polysilicon layer 18 typically comprises polysilicon doped with a conductivity enhancing dopant. Nitride spacers 30 are laterally adjacent wordlines 24 and 26.

Electrical node locations 25, 27 and 29 are between wordlines 24 and 26 and are electrically connected by transistor gates comprised by wordlines 24 and 26. Node locations 25, 27 and 29 are diffusion regions formed within semiconductive material 12.

A borophosphosilicate glass (BPSG) layer 34 is over semiconductive material 12 and wordlines 24 and 26. An oxide layer 32 is provided between BPSG layer 34 and material 12. Oxide layer 32 inhibits diffusion of phosphorus from BPSG layer 34 into underlying materials.

Conductive pedestals 54, 55 and 56 extend through BPSG layer 34 to node locations 25, 27 and 29, respectively. Capacitor constructions 62 and 64 contact upper surfaces of pedestals 54 and 56, respectively. Capacitor constructions 62 and 64 comprise a storage node layer 66, a dielectric layer 68, and a cell plate layer 70. Dielectric layer 68 comprises an electrically insulative layer, such as silicon nitride. Cell plate layer 70 comprises conductively doped polysilicon, and may alternatively be referred to as a cell layer 70. Storage node layer 66 comprises conductively doped hemispherical grain polysilicon.

A conductive bitline plug 75 contacts an upper surface of pedestal 55. Bitline plug 75 may comprise, for example, tungsten. Together, bitline plug 75 and pedestal 55 comprise a bitline contact 77.

A bitline 76 extends over capacitors 62 and 64 and in electrical connection with bitline contact 77. Bitline 76 may comprise, for example, aluminum.

The capacitors 62 and 64 are electrically connected to bitline contact 77 through transistor gates comprised by wordlines 26. A first DRAM cell 79 comprises capacitor 62 electrically connected to bitline 76 through a wordline 26 and bitline contact 77. A second DRAM cell 81 comprises capacitor 64 electrically connected to bitline 76 through wordline a 26 and bitline contact 77. DRAM array 83 comprises first and second DRAM cells 79 and 81.

SUMMARY OF THE INVENTION

The invention includes a number of methods and structures pertaining to semiconductor circuit technology, including: methods of forming DRAM memory cell constructions; methods of forming capacitor constructions; methods of forming capacitor and bitline constructions; DRAM memory cell constructions; capacitor constructions; capacitor and bitline constructions, conductive contact constructions, and integrated circuitry.

In one aspect, the invention includes a method of forming a capacitor storage node in a shape of a vertically elongated stem underlying a cap, the cap having a first cross-sectional dimension of equal to or greater than a minimum capable photolithographic feature dimension of a fabrication process, the stem having a second cross-sectional dimension of less than the first cross-sectional dimension.

In another aspect, the invention includes a capacitor construction comprising an electrically conductive pedestal which in lateral cross-section has a first lateral surface and a second lateral surface laterally opposing the first lateral surface; an inner electrically conductive layer against the first lateral surface and the second lateral surface; a first electrically insulative layer laterally adjacent the first and second lateral surfaces and laterally against the inner electrically conductive layer; an outer electrically conductive layer laterally adjacent the first and second lateral surfaces and laterally against the first electrically insulative layer; and a second electrically insulative layer laterally adjacent the first and second lateral surfaces and laterally outward of the outer conductive layer.

BRIEF DESCRIPTION OF THE DRAWINGS

Preferred embodiments of the invention are described below with reference to the following accompanying drawings.

DESCRIPTION OF THE PREFERRED EMBODIMENTS

A method of forming a DRAM array of the present invention is described with reference to FIGS. 2–22, with FIGS. 2–21 pertaining to a first embodiment of the invention, and FIG. 22 pertaining to a second embodiment of the invention. Like numerals from the preceding discussion of the prior art are utilized where appropriate, with differences being indicated by the suffix "a" or with different numerals.

Figure 1:
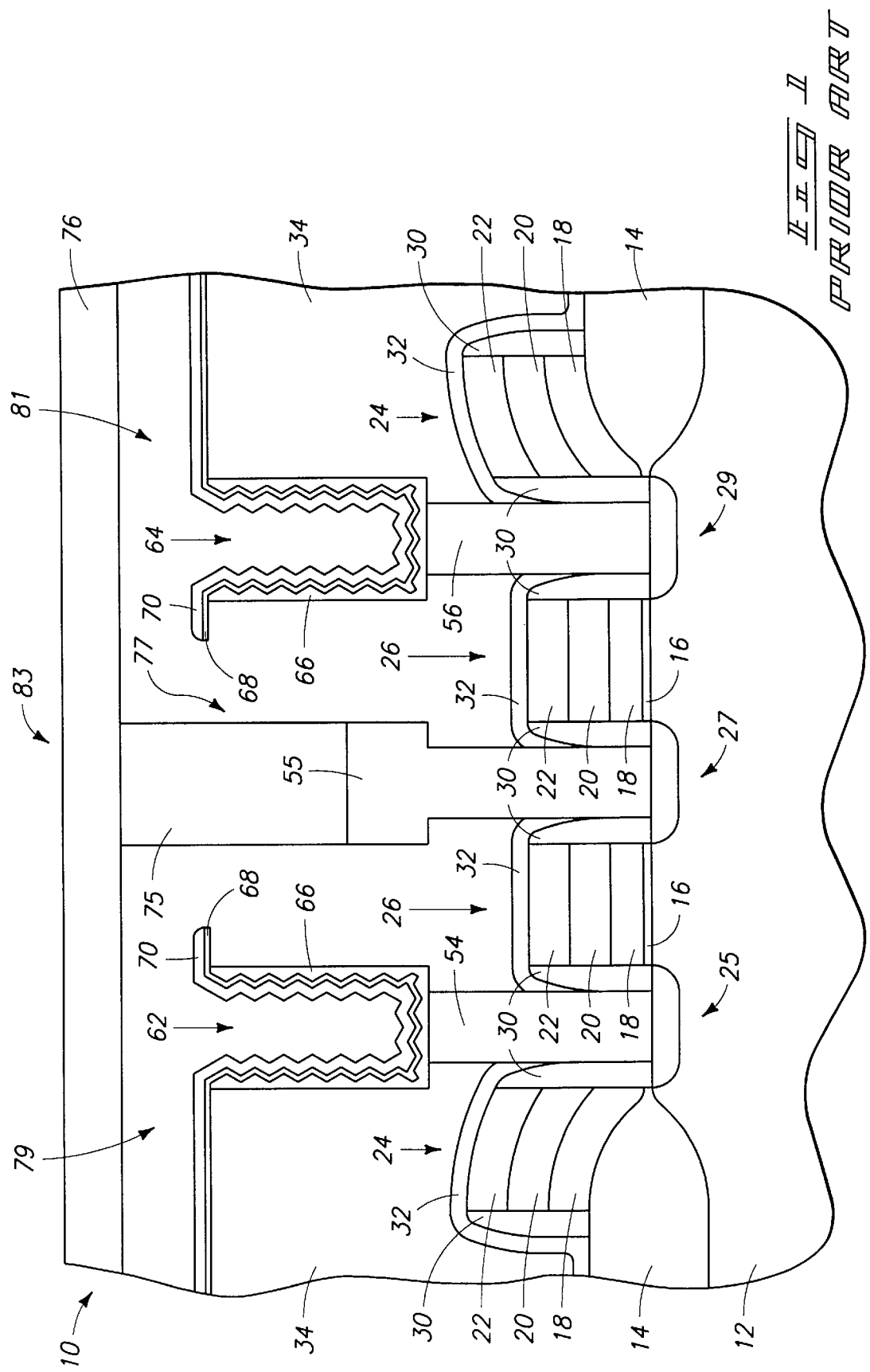
FIG. 1 is a schematic cross-sectional view of a semiconductor wafer fragment comprising a prior art DRAM cell.
Figure 2:
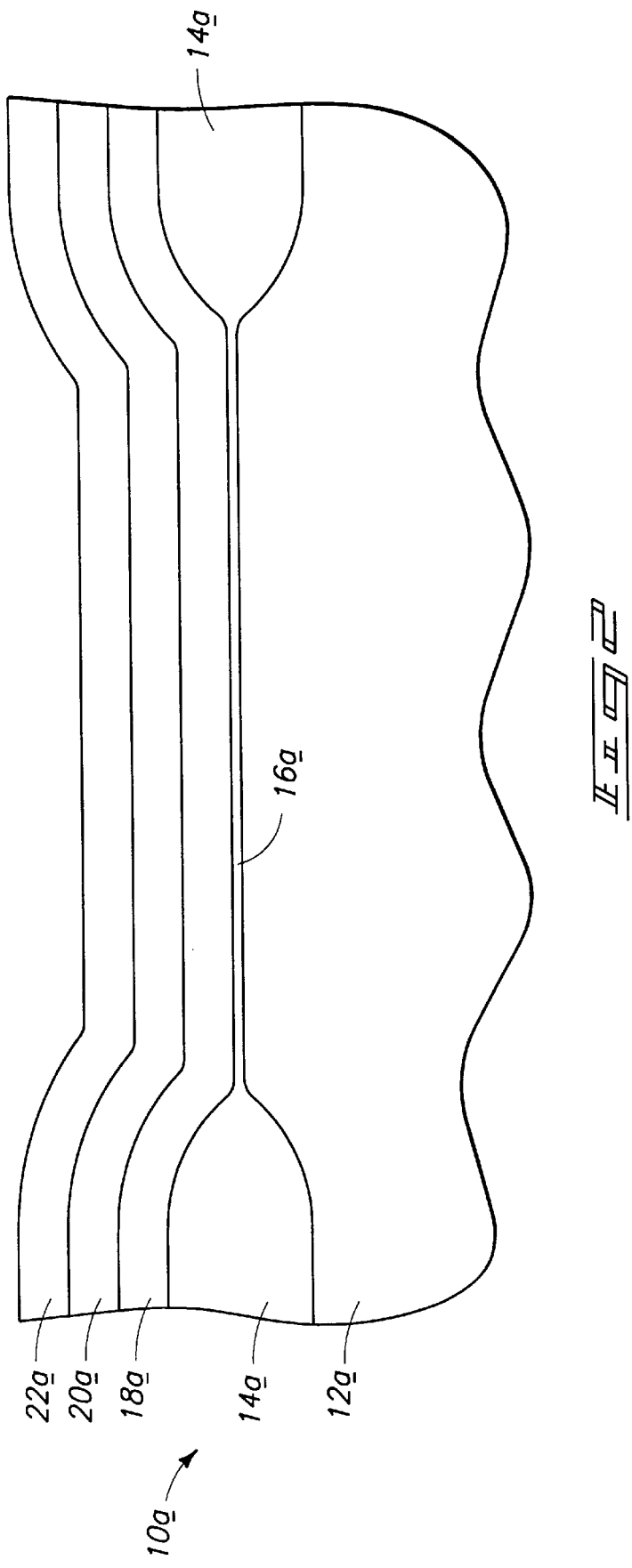
FIG. 2 is a schematic cross-sectional process view of a semiconductor wafer fragment at preliminary processing step of a processing method of the present invention.

Referring to FIG. 2, a semiconductor wafer fragment 10a is illustrated at a preliminary step of a process of the present invention. Wafer fragment 10a comprises a semiconductive material 12a, field oxide regions 14a, and a thin gate oxide layer 16a. Over gate oxide layer 16a is formed polysilicon layer 18a, silicide layer 20a and silicon oxide layer 22a. Silicide layer 20a comprises a refractory metal silicide, such as tungsten silicide, and polysilicon layer 18a typically comprises polysilicon doped with a conductivity enhancing dopant. Layers 16a, 18a, 20a and 22a can be formed by conventional methods.

Figure 3:
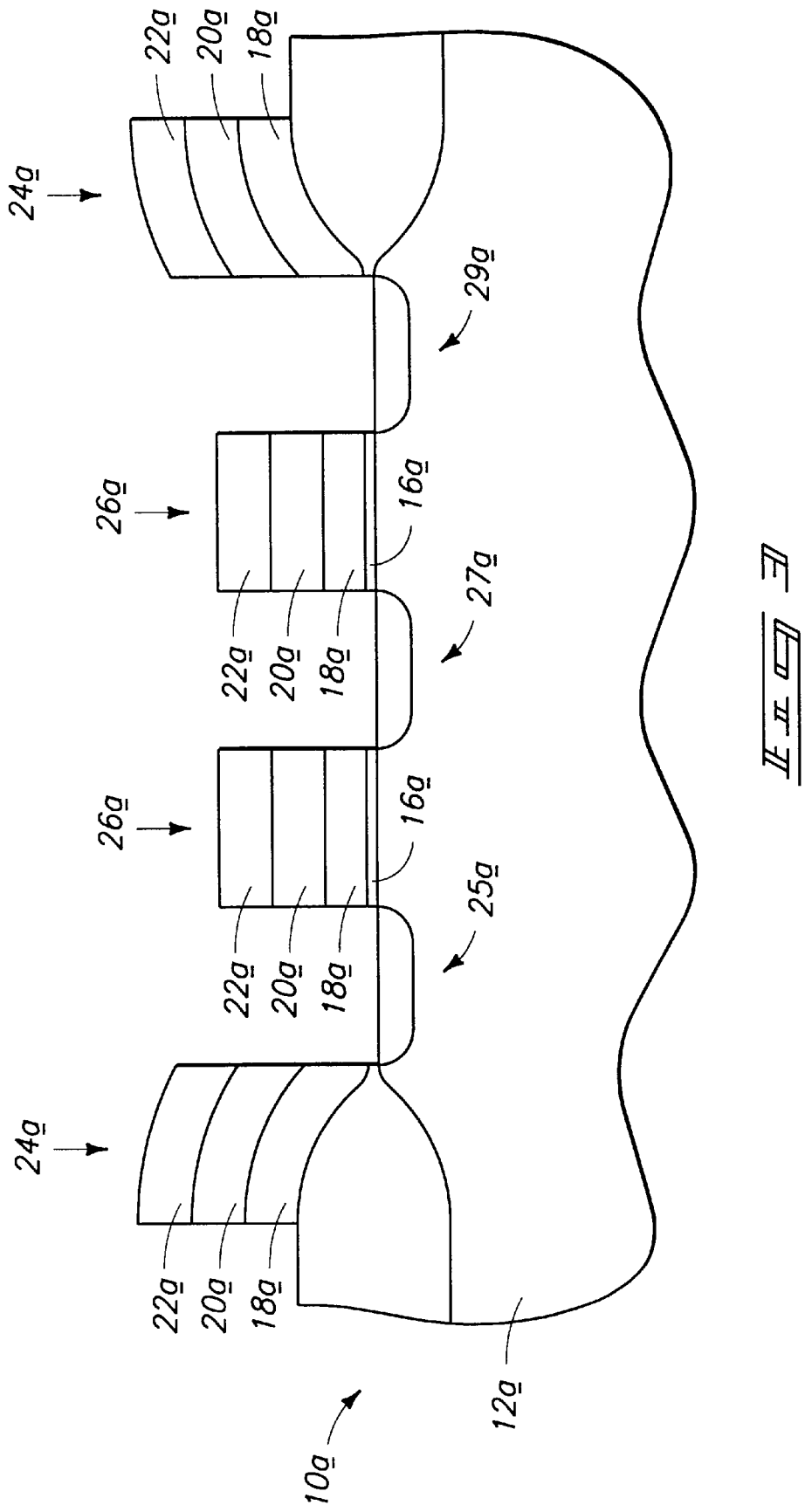
FIG. 3 is a view of the FIG. 2 wafer fragment at a processing step subsequent to that of FIG. 2.

Referring next to FIG. 3, polysilicon layer 18a, silicide layer 20a and silicon oxide layer 22a are etched to form wordlines 24a and 26a. Such etching can be accomplished by conventional methods. Between wordlines 24a and 26a are defined electrical node locations 25a, 27a and 29a, with wordlines 26a comprising transistor gates which electrically connect node locations 25a, 27a, and 29a. Node locations 25a, 27a and 29a are diffusion regions formed within semiconductive material 12a by ion implanting conductivity enhancing dopant into the material 12a. Such ion implanting may occur after patterning wordlines 24a and 26a, utilizing wordlines 24a and 26a as masks. Alternatively, the diffusion regions may be formed prior to deposition of one or more of layers 18a, 20a and 22a (shown in FIG. 2). In yet other alternative methods, the diffusion regions may be formed after formation of doped polysilicon pedestals (such as the pedestals 116, 117 and 118 shown in FIG. 11, and to be described subsequently) by out-diffusion of conductivity enhancing dopant from the pedestals.

Figure 4:
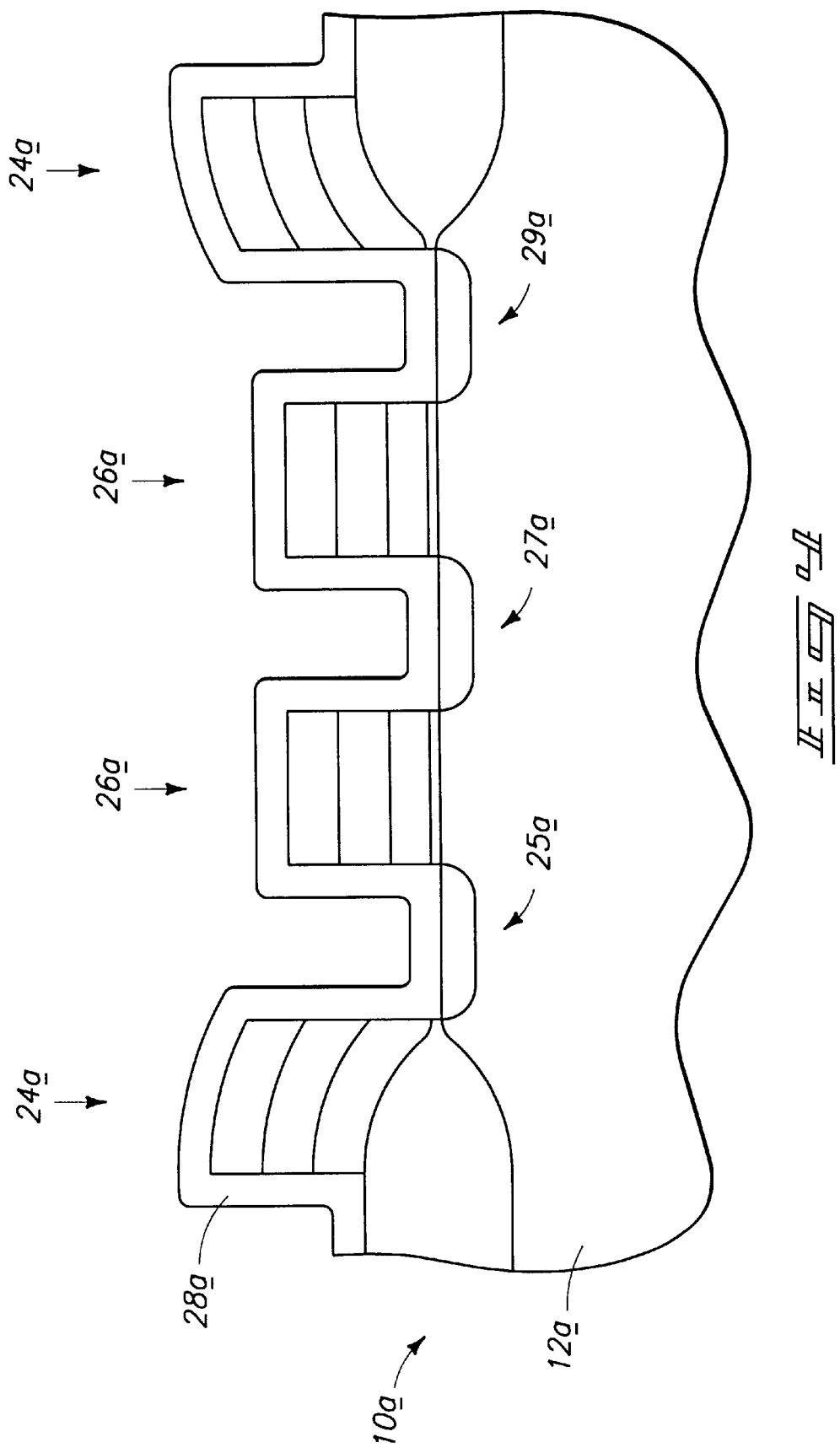
FIG. 4 is a view of the FIG. 2 wafer fragment at a processing step subsequent to that of FIG. 3.
Figure 5:
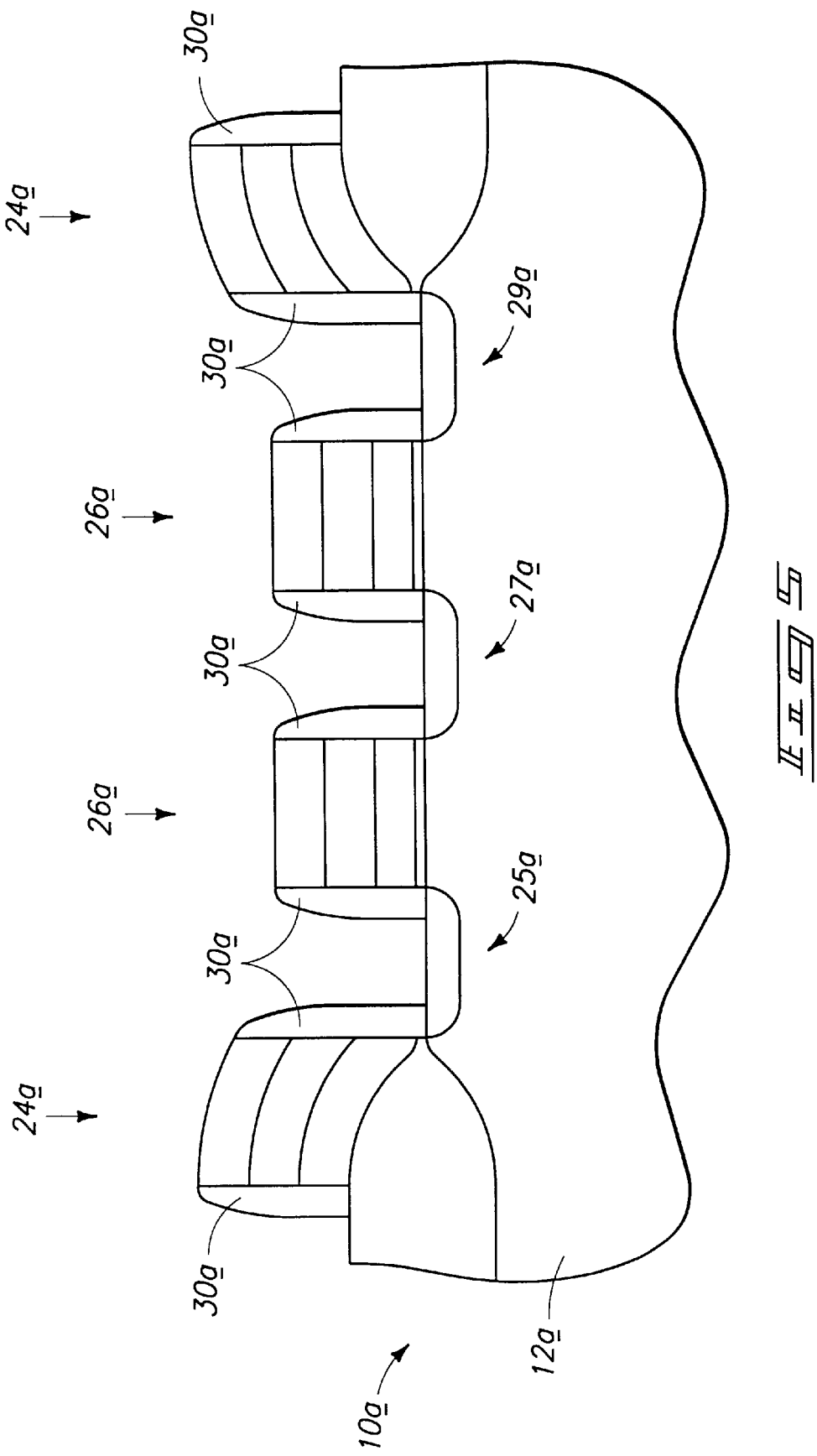
FIG. 5. is a view of the FIG. 2 wafer fragment at a processing step subsequent to that of FIG. 4.

For the above-discussed reasons, defined electrical node locations 25a, 27a, and 29a need not be electrically conductive at the preliminary step of FIG. 3. Node locations 25a, 27a and 29a can be conductive at the step of FIG. 3 if formed by ion implanting of dopant into semiconductive material 12a. On the other hand, node locations 25a, 27a and 29a can be substantially non-conductive at the preliminary step of FIG. 3 in, for example, embodiments in which node locations 25a, 27a and 29a are ultimately doped by out-diffusion of dopant from conductively doped pedestals, such as the pedestals 116, 117 and 118 of FIG. 11. Referring to FIGS. 4 and 5, a nitride layer 28a is provided over wordlines 24a and 26a and subsequently etched to form nitride spacers 30a laterally adjacent wordlines 24a and 26a.

Figure 6:
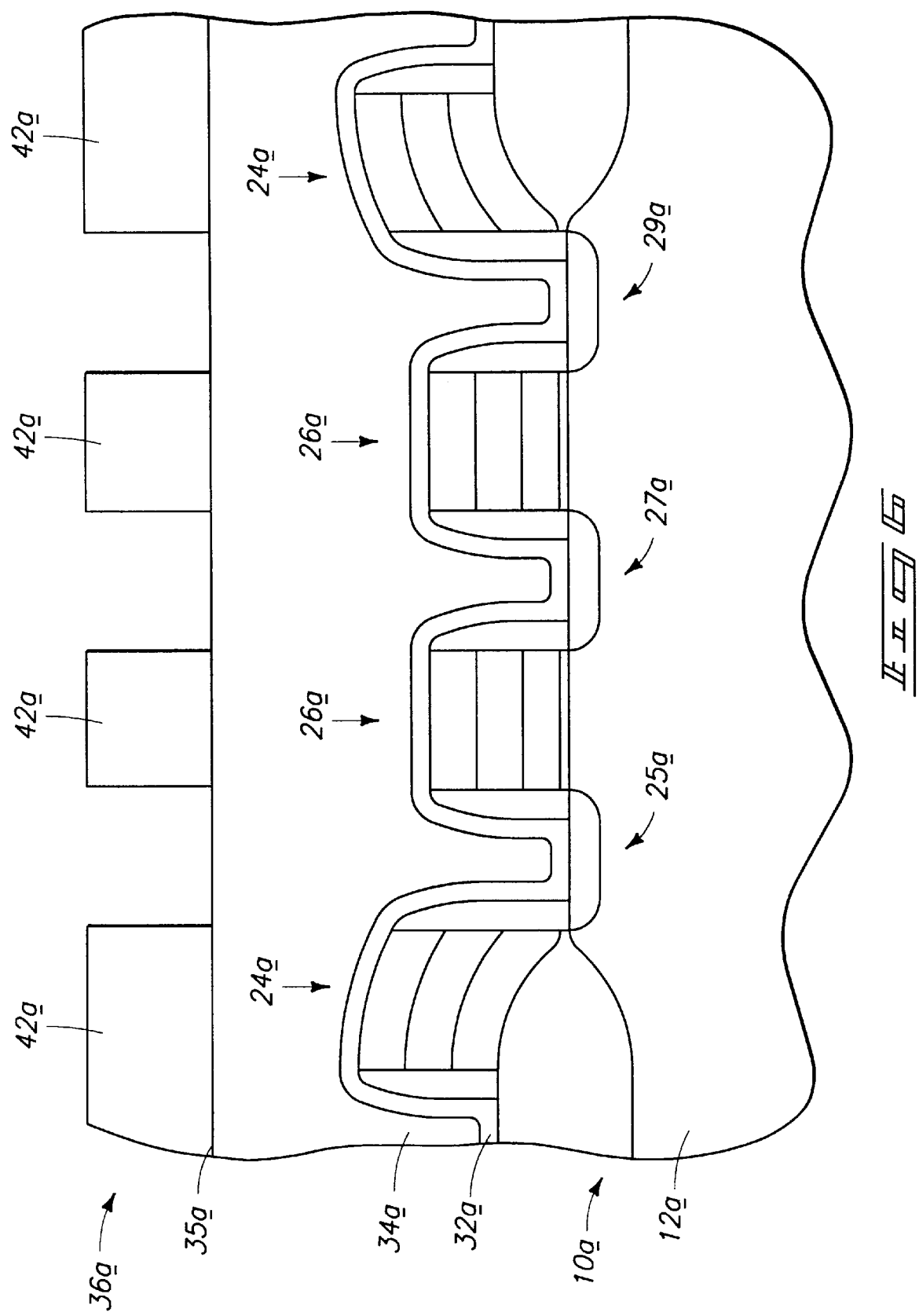
FIG. 6 is a view of the FIG. 2 wafer fragment at a processing step subsequent to that of FIG. 5.

Referring to FIG. 6, an overlying oxide layer 32a is provided over wordlines 24a and 26a, and a BPSG layer 34a is provided over oxide layer 32a and planarized. Overlying oxide layer 32a is typically about 500 Angstroms thick and BPSG layer 34a is typically about 14,000 Angstroms thick. BPSG layer 34a is planarized, for example, by chemical-mechanical polishing. Such planarization forms a planar upper surface 35a.

After the planarization of layer 34a, a patterned polysilicon masking layer 36a is provided over layer 34a. Layer 36a preferably comprises a semiconductive material, more preferably comprises silicon, and most preferably comprises undoped polysilicon. Masking layer 36a might also comprise silicon nitride or polyimide. Masking layer 36a preferably has a thickness of about 3000 Angstroms. Generally, formation of patterned polysilicon layer 36a comprises provision of a patterned photoresist layer over an unpatterned polysilicon layer, followed by a conventional etch of the polysilicon to transfer a pattern from the patterned photoresist layer to the polysilicon and thereby form patterned polysilicon layer 36a. In the shown cross-sectional view, masking layer 36a comprises masking layer segments 42a. Masking layer 36a defines unmasked portions 78, 80 and 82 (labelled in FIG. 7); and masked portions 84, 86, 88 and 90 (labelled in FIG. 7) of insulative layer 34a.

Figure 7:
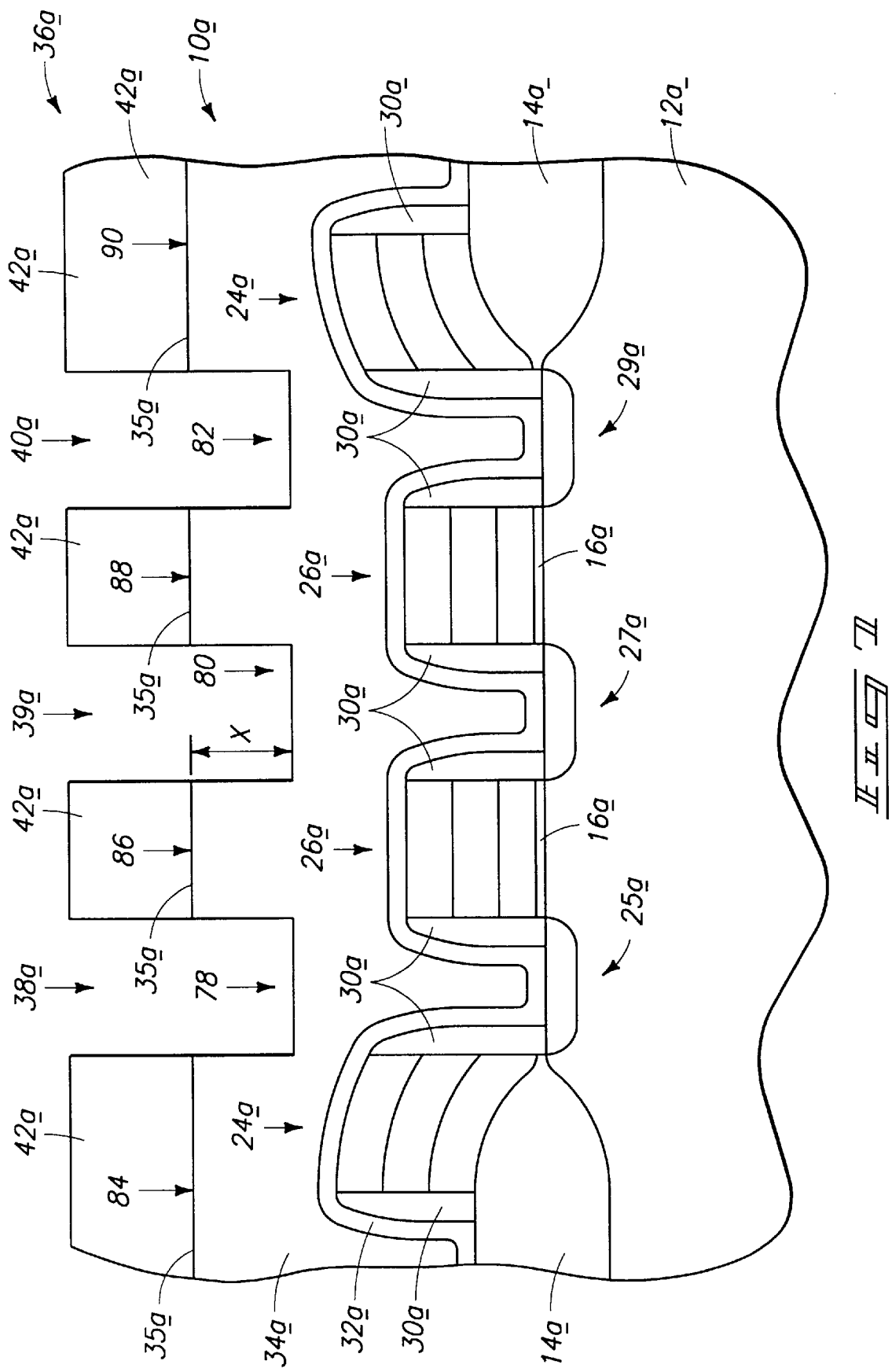
FIG. 7 is a view of the FIG. 2 wafer fragment at a processing step subsequent to that of FIG. 6.

Referring to FIG. 7, openings 38a, 39a and 40a are etched through patterned polysilicon layer 36a and into BPSG layer 34a, typically using a timed anisotropic dry etch. Openings 38a, 39a, and 40a preferably comprise a depth "X" of about 10,000 Angstroms. Openings 38a, 39a, and 40a also preferably comprise a minimum cross-sectional width approximately equal to the minimum capable photolithographic dimension obtainable during fabrication, which can be about 0.3 microns. If the minimum capable dimension decreases in the future, smaller dimensions will be utilized in accordance with preferred aspects of the invention.

Figure 8:
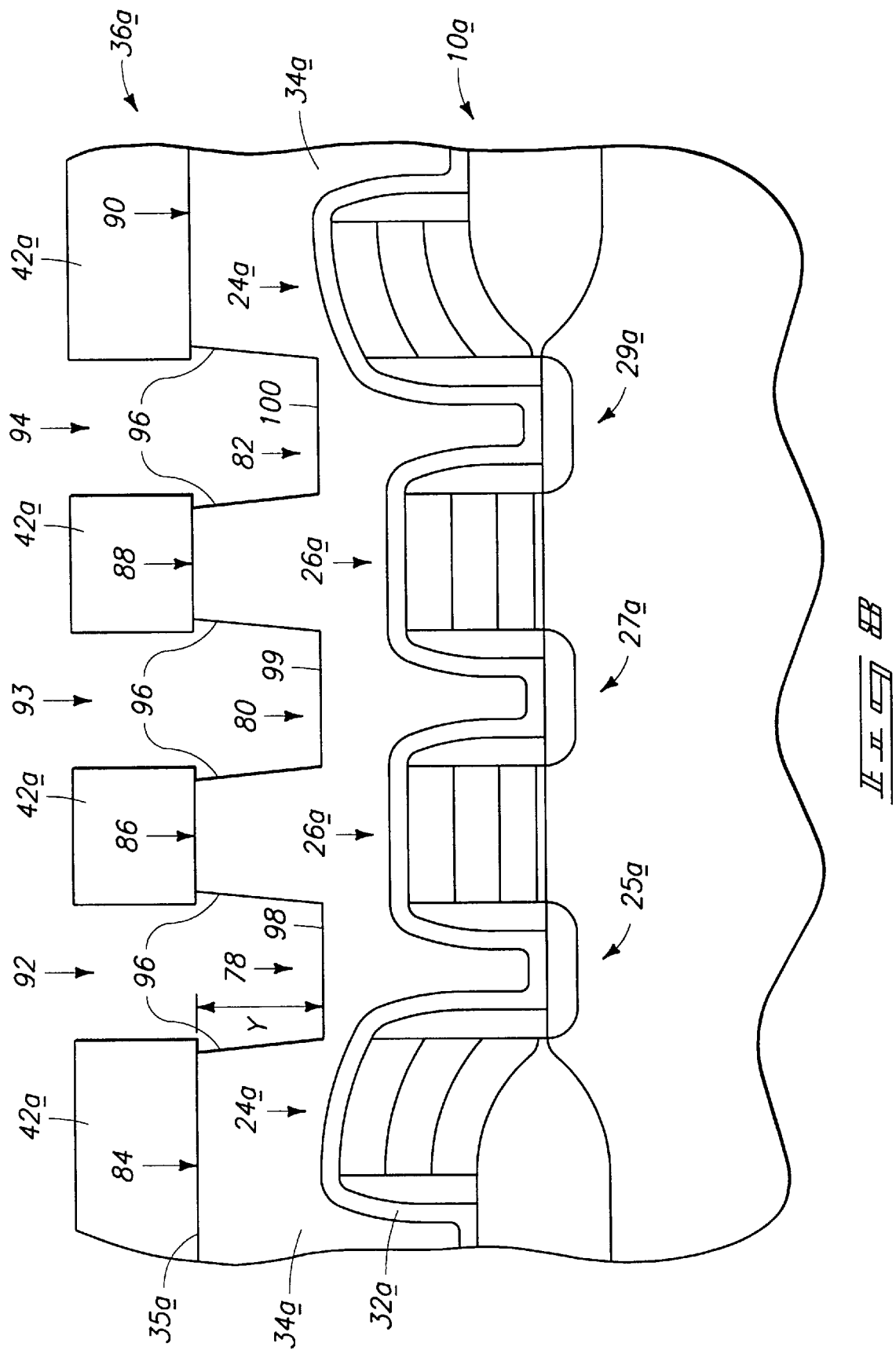
FIG. 8 is a view of the FIG. 2 wafer fragment at a processing step subsequent to that of FIG. 7.

Referring to FIG. 8, insulative layer 34a is selectively etched relative to masking layer 42a to form expanded openings 92, 93 and 94 from openings 38a, 39a and 40a (shown in FIG. 7), respectively. Expanded openings 92, 93 and 94 extend only partially into insulative layer 34a, and therefore do not extend entirely to node locations 25a, 27a and 29a. Accordingly, expanded openings 92, 93 and 94 comprise bases 98, 99 and 100 which are above node locations 25a, 27a and 29a.

In the shown preferred embodiment, the etching removes parts of masked portions 84, 86, 88 and 90 of insulative layer 34a, as well as parts of unmasked portions 78, 80 and 82 of insulative layer 34a. Thus, expanded openings 92, 93 and 94 undercut portions of masking layer 36a. In a preferred embodiment, wherein insulative layer 34a comprises BPSG and masking layer 36a comprises undoped polysilicon, such etch will, for example, comprise an isotropic wet etch utilizing hydrogen fluoride. Such isotropic etching forms the shown preferred contact openings 92, 93 and 94 with sloped sidewalls 96 and a widened cross-sectional area at upper surface 35a relative to bases 98, 99 and 100 of the respective openings 92, 93 and 94.

Expanded openings 92, 93 and 94 preferably comprise a depth "Y" from upper surface 35a to their respective bases 98, 99 and 100, of about 10,750 Angstroms. Expanded openings 92, 93 and 94 preferably comprise minimum cross-sectional widths, at their respective bases, of from about 0.3 Angstroms to about 0.6 Angstroms. For purposes of the following discussion, expanded openings 92, 93 and 94 may be referred to as first opening 92, second opening 93 and third opening 94.

Figure 9:
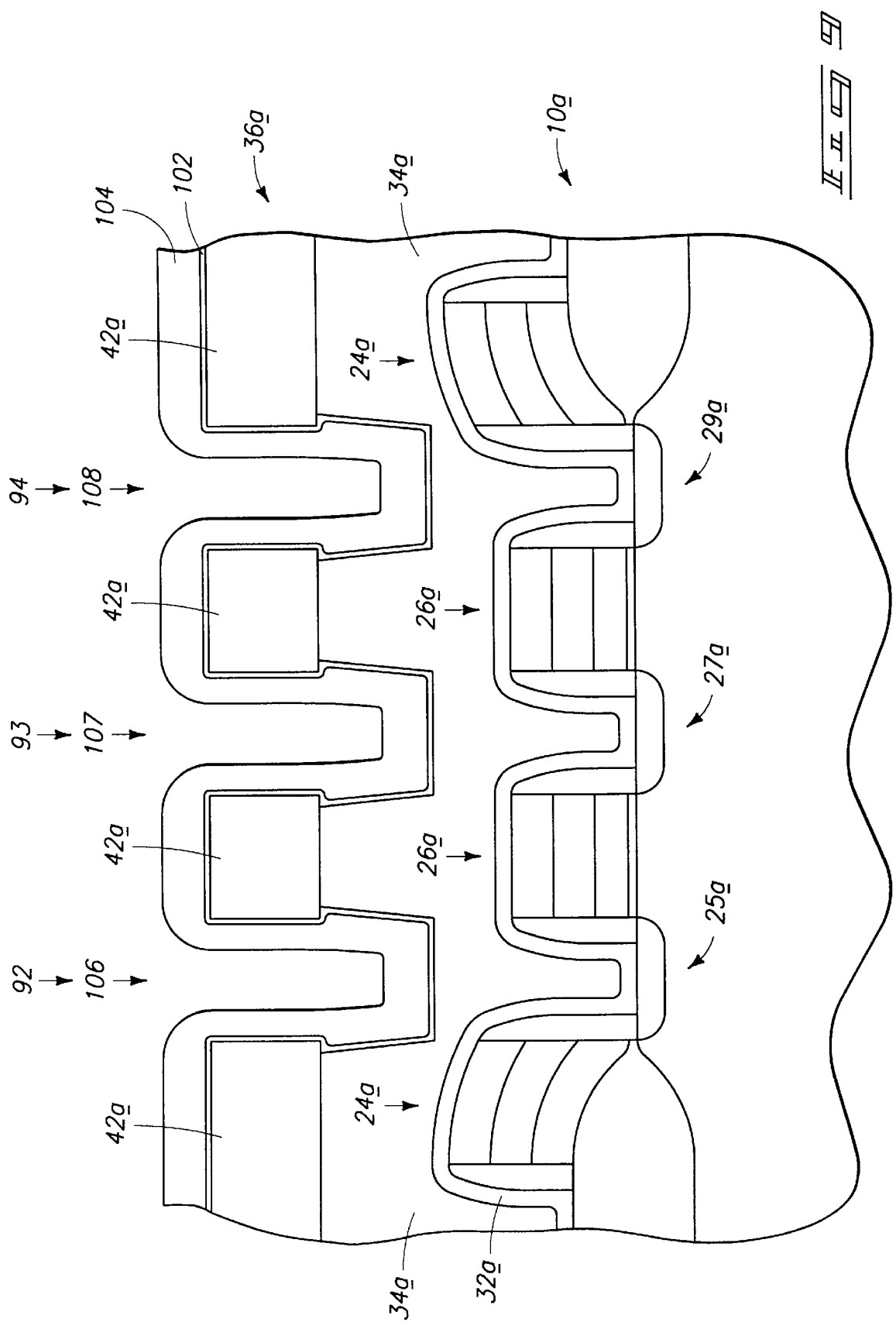
FIG. 9 is a view of the FIG. 2 wafer fragment at a processing step subsequent to that of FIG. 8.

Referring next to FIG. 9, an etch restriction layer 102 is provided over masking layer 36a and within openings 92, 93 and 94. Etch restriction layer 102 is utilized to inhibit etching into BPSG layer 34a during subsequent processing steps, and preferably comprises silicon oxide or silicon nitride. Methods for forming such silicon nitride or silicon oxide layers are known to persons of skill in the art. An example method for forming a silicon oxide layer would comprise chemical vapor deposition utilizing tetraethylorthosilicate (TEOS). Etch restriction layer 102 preferably comprises a thickness of from about 300 Angstroms to about 500 Angstroms.

Over etch restriction layer 102 is provided a sacrificial layer 104. Sacrificial layer 104 is preferably selectively etchable relative to restriction layer 102, and is also preferably selectively etchable relative to a doped polysilicon pedestal which will ultimately be formed within openings 92, 93 and 94 (polysilicon pedestals 116, 117 and 118 are shown, for example, in FIG. 11). Example materials for layer 104 include silicon nitride, silicon oxide, and undoped polysilicon. Preferably, if sacrificial layer 104 comprises silicon oxide, then etch restriction layer 102 comprises silicon nitride, and vice versa. Sacrificial layer 104 preferably comprises a thickness of about 1500 Angstroms.

Formation of layers 102 and 104 forms narrowed constrictions 106, 107 and 108 at the mouths of openings 92, 93 and 94, respectively, and between masking layer segments 42a. As discussed above, in a preferred embodiment of the invention, openings 38a, 39a, and 40a (shown in FIG. 7) comprise a first cross-sectional minimum dimension of about equal to a minimum capable photolithographic feature dimension obtainable during fabrication. Accordingly, once layers 102 and 104 partially fill these openings, the openings have a cross-sectional dimension of less than such minimum capable photolithographic feature dimension. An example minimum cross-sectional dimension obtained for narrowed constrictions 106, 107 and 108 is about 0.17 microns.

Figure 10:
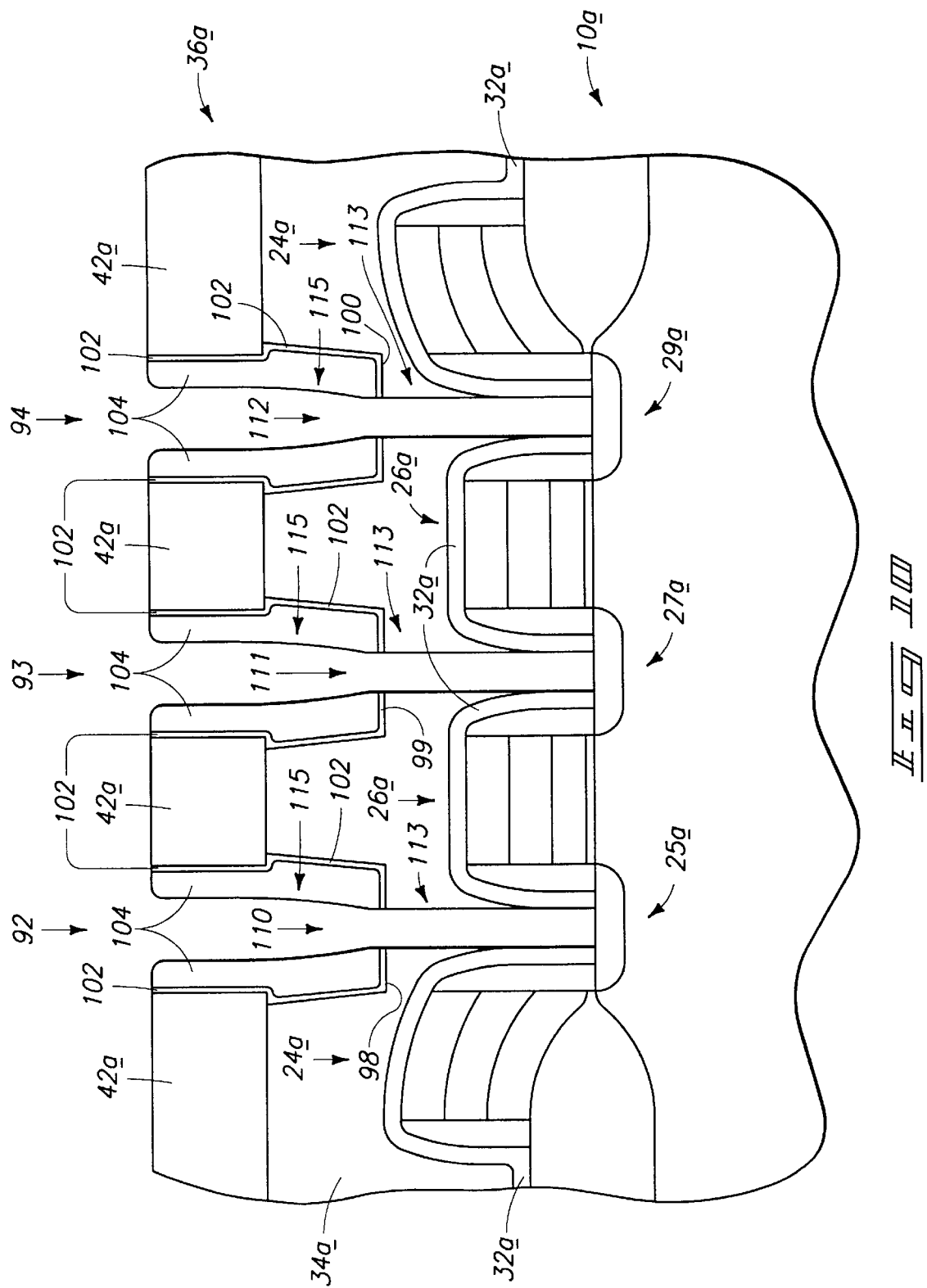
FIG. 10 is a view of the FIG. 2 wafer fragment at a step subsequent to that of FIG. 9.

Referring to FIG. 10, fourth, fifth and sixth openings 110, 111 and 112 are formed, or extended, from first, second and third openings 92, 93 and 94, respectively, by appropriate anisotropic etching. Openings 110, 111 and 112 extend through layers 32a, 34a, 102 and 104 to node locations 25a, 27a and 29a, respectively.

As shown, the combination of first opening 92 and fourth opening 110 preferably forms an opening having a shape of a vertically elongated stem 113 underlying a cap 115. Similarly, the combination of openings 93 and 111, and the combination of openings 94 and 112 comprise shapes of vertically elongated stems 113 underlying caps 115. It is noted that the respective caps and stems will both preferably comprise cross-sectional dimensions of less than the minimum capable photolithographic feature dimension obtainable during fabrication. Preferably, stems 110, 111 and 112 will have cross-sectional dimensions of about the minimum cross-sectional dimensions of narrowed constrictions 106, 107 and 108 in FIG. 9. However, the cross-sectional dimensions of stems 110, 111 and 112 may be slightly larger than the dimensions of constrictions 106, 107 and 108, as the constriction openings may be widened somewhat by removal of layers 102 and 104 from the sides of the constriction openings as the layers 102 and 104 are etched from the bases of openings 92, 93 and 94.

Openings 110, 111 and 112 can be formed, for example, by an anisotropic spacer etch and an oxide etch followed by a clean. More specifically, openings 110, 111 and 112 can be formed by a spacer etch utilizing $Cl_2$, followed by an oxide etch utilizing $CF_4$ and $CHF_3$. In the shown preferred embodiment, the etch of layers 102 and 104 to form openings 110, 111 and 112 removes layers 102 and 104 from over masking layer 36a.

Figure 11:
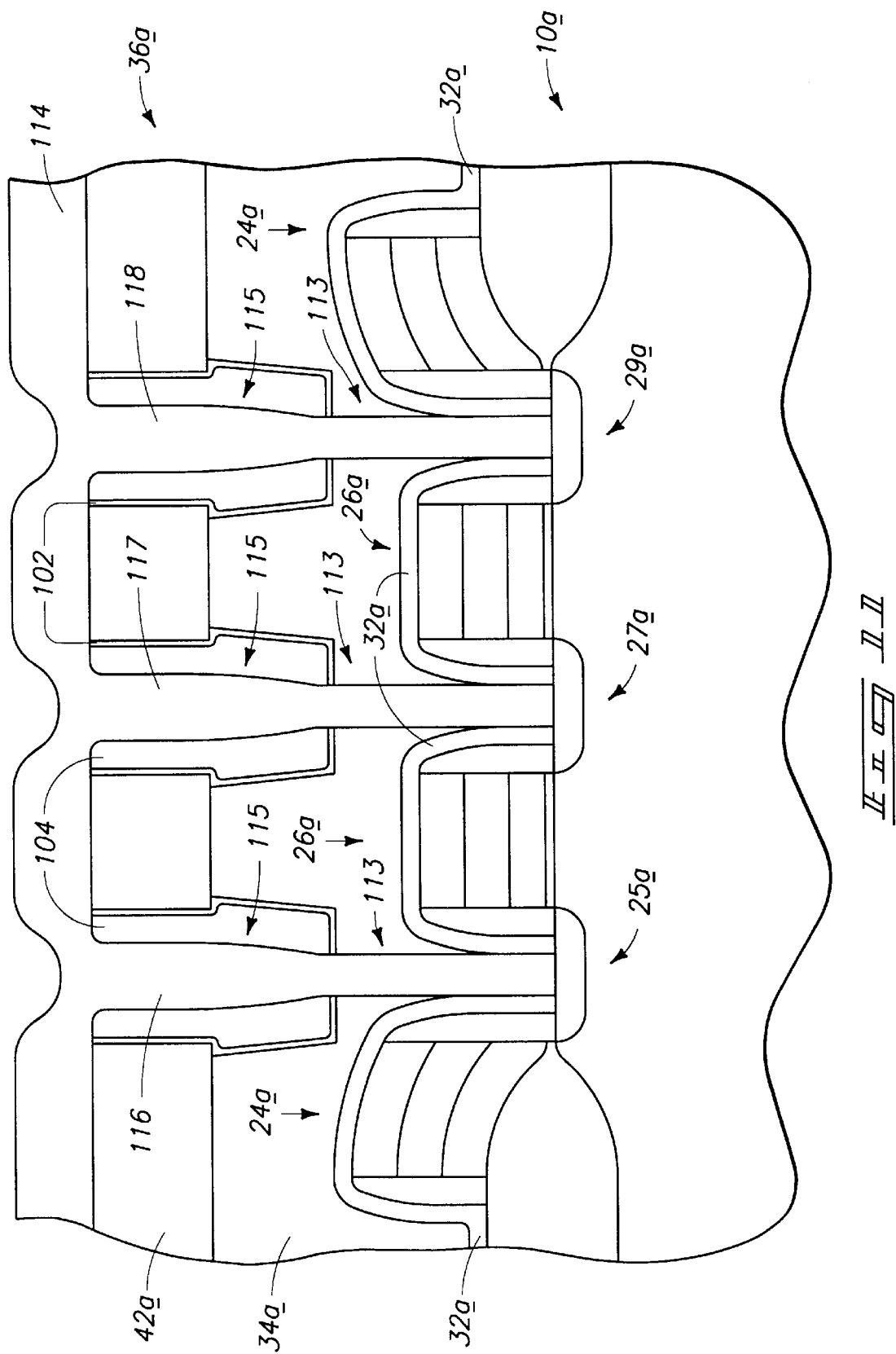
FIG. 11 is a view of the FIG. 2 wafer fragment at a step subsequent to that of FIG. 10.

Referring to FIG. 11, a layer of conductive material 114 is deposited over masking layer 36a and within openings 92, 93, 94, 110, 111 and 112 (shown in FIG. 10), to fill the openings and form conductive pedestals 116, 117 and 118 laterally against layer 104.

Conductive material 114 preferably comprises doped polysilicon, with the polysilicon being preferably doped to a concentration of greater than about $1 \times 10^{19}$ ions/cm$^3$ with a conductivity enhancing impurity.

Figure 12:
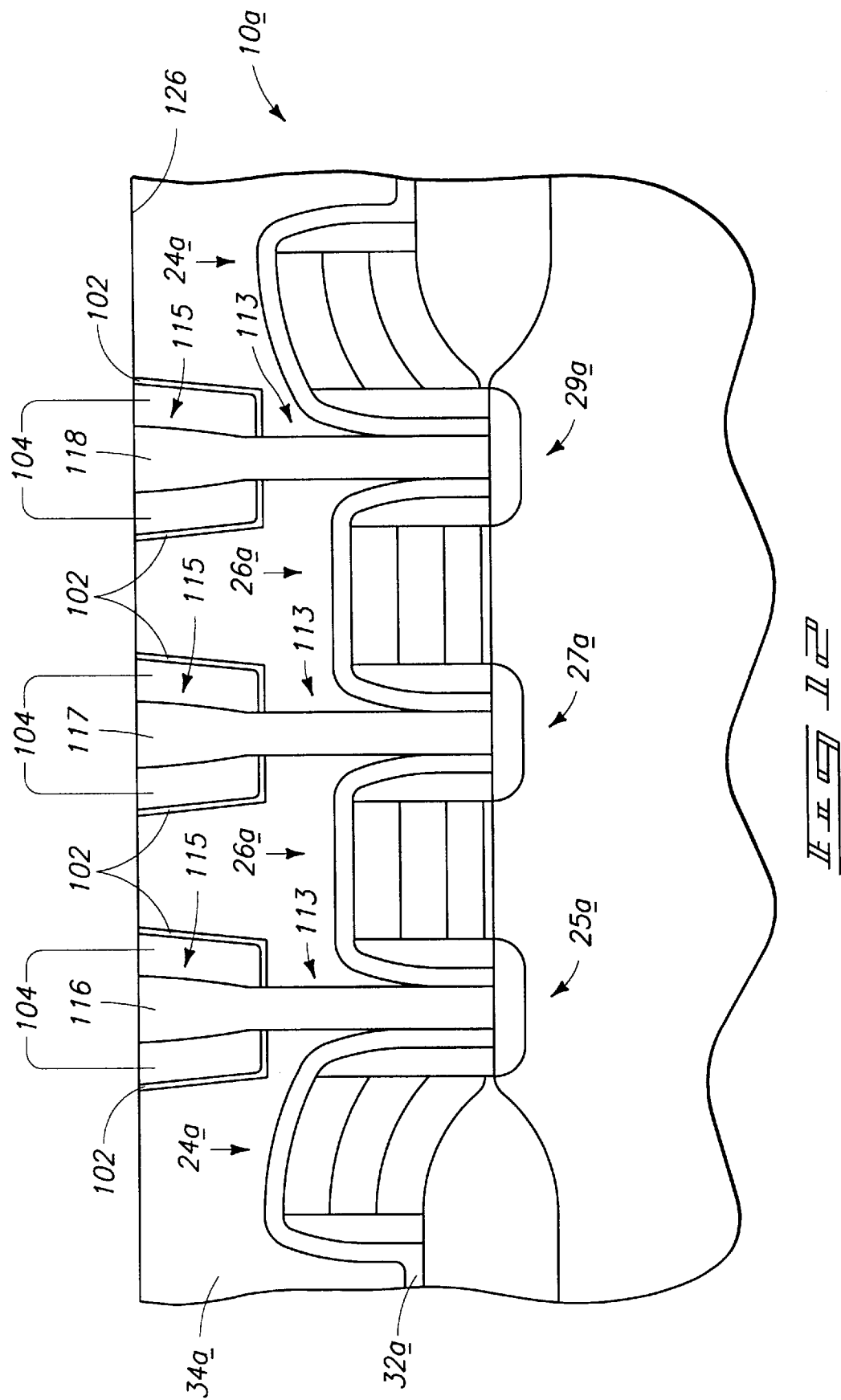
FIG. 12 is a view of the FIG. 2 wafer fragment at a step subsequent to that of FIG. 11.

Referring to FIG. 12, an upper surface of wafer fragment 10a is removed. Preferably, such removal planarizes the remaining upper surface of wafer fragment 10a. Such planarization may be accomplished, for example, by chemical-mechanical polishing or other techniques. Preferably, the planarization removes layer 36a (shown in FIG. 11) to expose a surface 126 of insulative layer 34a. Surface 126 may be identical to the original upper surface 35a of insulative layer 34a or may be beneath the original surface 35a of insulative layer 34a. The planarization to below layer 36a electrically isolates conductive pedestals 116, 117 and 118 from one another. As shown, the preferred isolated pedestals 116, 117 and 118 have the shape of a cap 115 over a stem 113, as did the openings discussed above with reference to FIG. 10.

Figure 13:
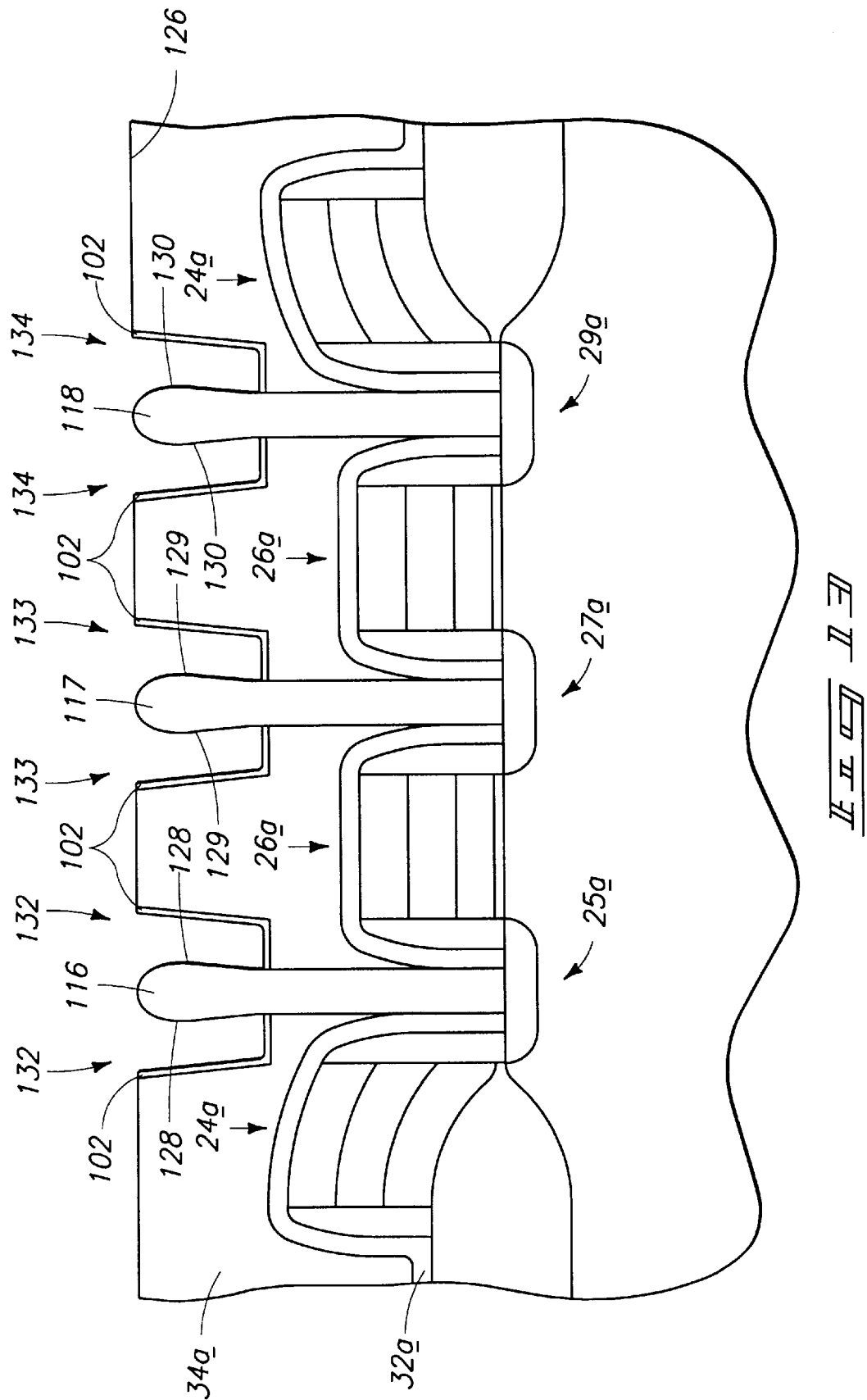
FIG. 13 is a view of the FIG. 2 wafer fragment at a step subsequent to that of FIG. 12 processed according to a first embodiment of the present invention.

Referring next to FIG. 13, sacrificial layer 104 (shown in FIG. 12) is removed. Although methods for removal of sacrificial layer 104 will vary depending on the material used for layer 104, methods for removal of various types of layer 104 are readily apparent to persons of ordinary skill in the art. Example conditions for removal of layer 104 when layer 104 consists of the preferred undoped polysilicon include etching with a tetramethyl ammonium hydroxide (TMAH) solution (2.5% in water) at 30° C. Such etch conditions are selective for undoped polysilicon relative to doped polysilicon, with selectivity commonly being about 40:1 when the doped polysilicon comprises greater than $1\times10^{19}$ ions of dopant/cm$^3$. Thus, the conditions are selective for removing the undoped polysilicon of sacrificial layer 104 relative the doped polysilicon of pedestals 116, 117 and 118. However, although the conditions are selective for removal of undoped polysilicon relative to doped polysilicon, there will be some removal of the doped polysilicon. Thus, in the illustrated preferred embodiment of FIG. 13, the etch rounds upper exposed surfaces of doped polysilicon pedestals 116, 117 and 118.

After removal of sacrificial layer 104, pedestals 116, 117 and 118 comprise exposed lateral surfaces 128, 129 and 130, respectively. Between respective lateral surfaces 128, 129 and 130, and etch restriction layer 102, are gaps 132, 133 and 134.

In preferred embodiments, pedestals 116, 117 and 118 will comprise a circular or curvaceous horizontal cross-sectional shape (as 24 shown in FIG. 16), such that the shown lateral surfaces 128, 129 and 130 are continuous around the pedestals. However, for purposes of the following discussion the shown lateral surfaces on opposing sides of the pedestals may be referred to as opposing lateral surfaces, as they appear to be opposing surfaces in the cross-sectional views of FIGS. 11–21. Use of the term "opposing lateral surfaces" in either this disclosure or the claims that follow is not to be understood as being limited to embodiments of the pedestals having non-curvaceous horizontal cross-sectional shapes.

Figure 14:
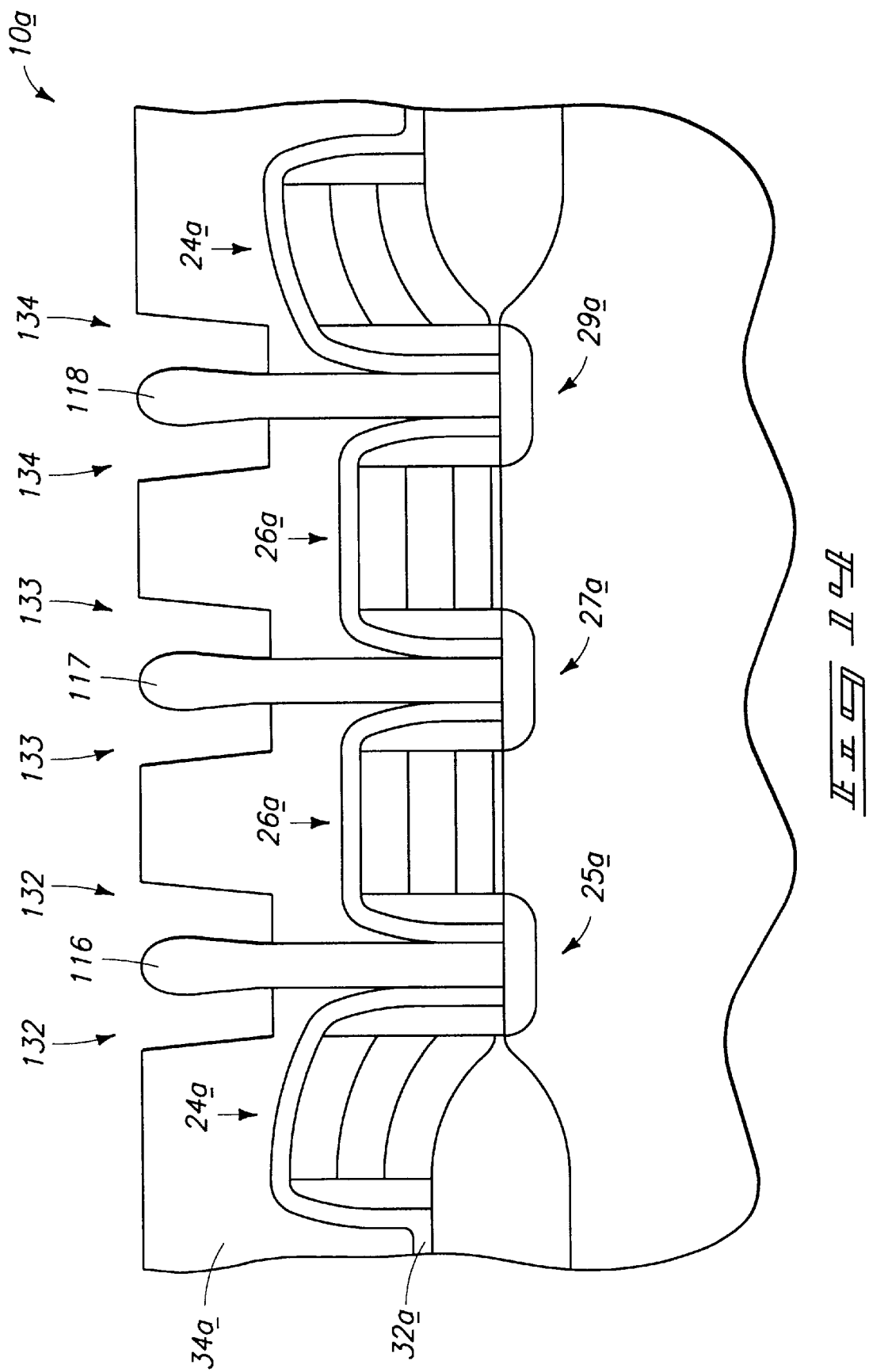
FIG. 14 is a view of the FIG. 2 wafer fragment at a processing step subsequent to that of FIG. 13.

Referring to FIG. 14, etch restriction layer 102 is removed. Methods for removing etch restriction layer 102 will vary depending on the material utilized for the restriction layer, but will be readily recognized by persons of skill in the art. An example method for removing etch restriction layer 102, when the restriction layer is silicon oxide, comprises an HF based isotropic wet etch. Removal of etch restriction layer 102 widens gaps 132, 133 and 134 to extend to layer 34*a*.

Figure 15:
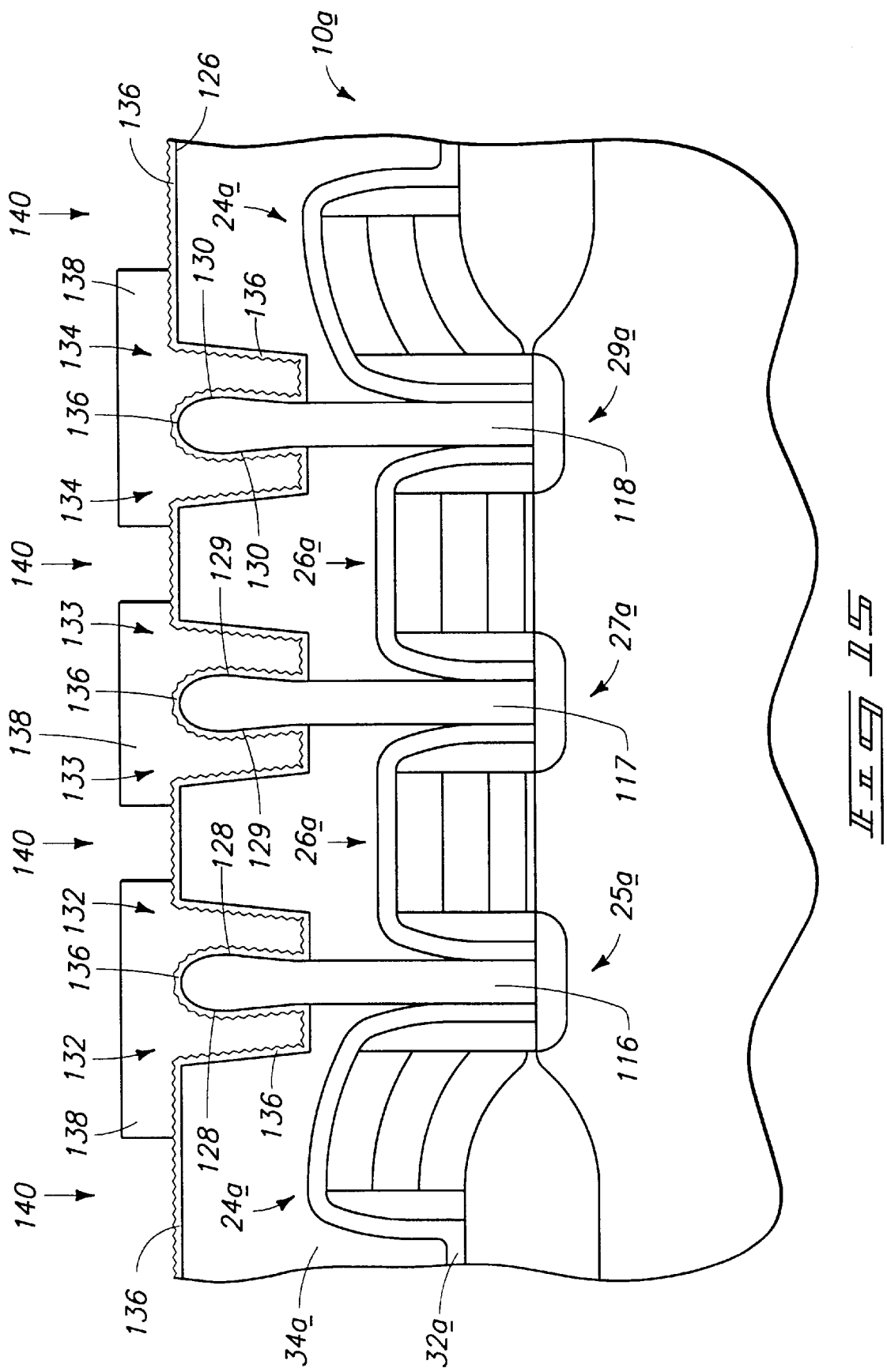
FIG. 15 is a view of the FIG. 2 wafer fragment at a processing step subsequent to that of FIG. 14.

Referring to FIG. 15, a storage node layer 136 is provided within gaps 132, 133 and 134 and against lateral surfaces 128, 129 and 130 of pedestals 116, 117 and 118. Layer 136 also extends over upper surface 126 of layer 34*a*. Storage node layer 136 preferably comprises doped polysilicon, and most preferably comprises a doped rugged polysilicon, such as doped polysilicon selected from the group consisting of hemispherical grain polysilicon and cylindrical grain polysilicon. The rugged polysilicon provides surface irregularities which increase the surface area of storage node layer 136.

In the shown preferred embodiment, a patterned masking layer 138 is provided over pedestals 116, 117 and 118 to leave exposed portions 140 of layer 136 between the pedestals. Patterned masking layer 138 preferably comprises photoresist. Exposed portions 140 are subsequently removed to electrically isolate pedestals 116, 117 and 118 from one another. Persons of ordinary skill in the art will recognize that pedestals 116, 117 and 118 could also be electrically isolated from one another, without use of patterned masking layer 138, by a planarization of wafer 10*a* to remove layer 136 from upper surface 126.

Figure 16:
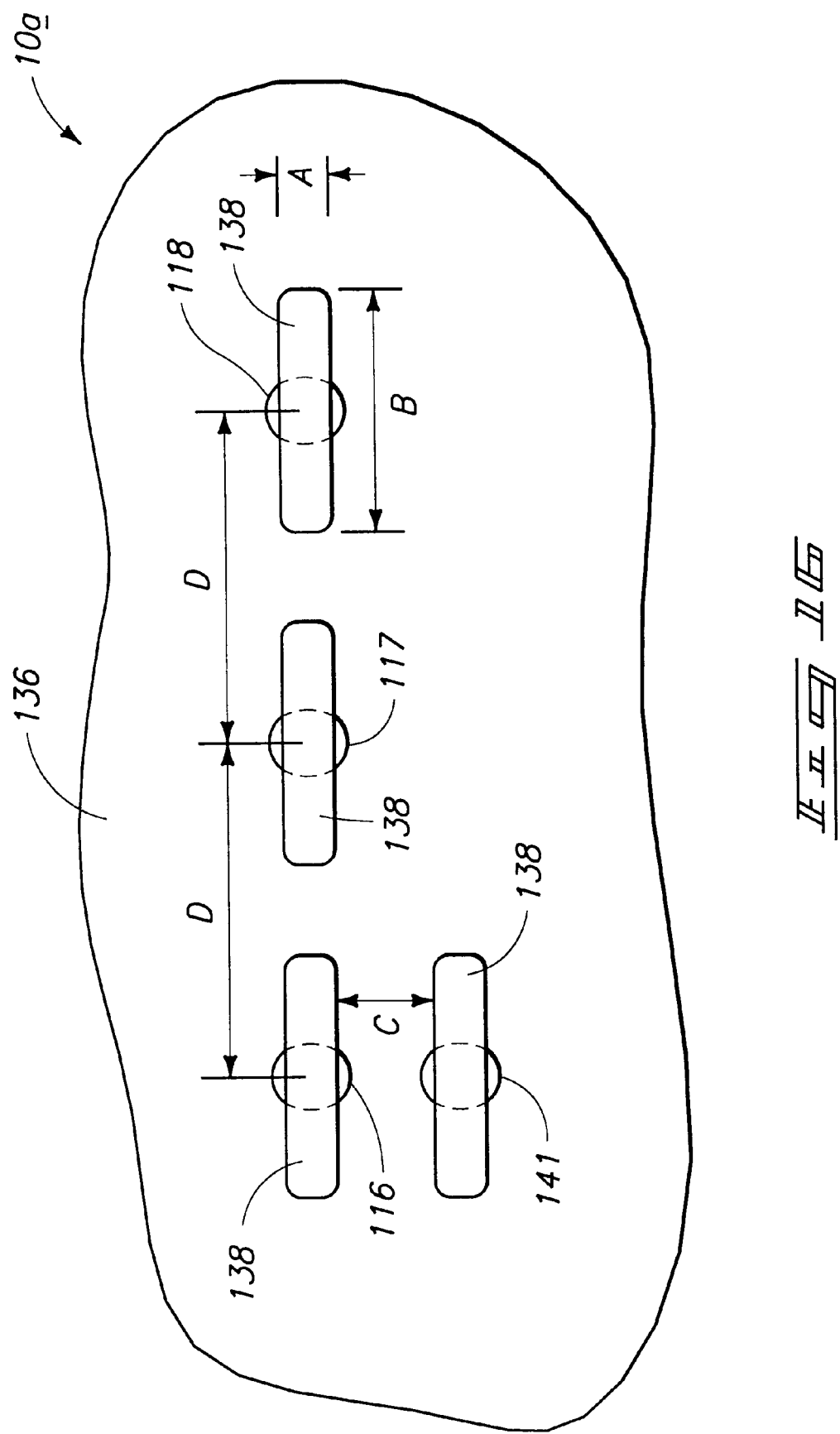
FIG. 16 is a top view of FIG. 15 wafer fragment.

A top view of the FIG. 15 structure is shown in FIG. 16, with pedestals 116, 117 and 118 illustrated in partial phantom view beneath photoresist layer blocks 138. The partial phantom view of pedestals 116, 117 and 118 illustrates the circular or curvaceous horizontal cross-sectional shape of the pedestals and illustrates that the pedestals comprise continuous lateral peripheries extending around a circumference of the pedestals. Photoresist layer blocks comprise a preferred width "A" of about 0.4 Angstroms, and a preferred length "B" of about 0.6 Angstroms. Pedestals 116 and 118 are preferably laterally displaced from pedestal 117 by a distance "D" of about 0.8 Angstroms. A closest longitudinally-displaced pedestal 141 is shown relative to pedestal 116. Preferably, a photoresist block 138 over pedestal 116 is longitudinally separated from a photoresist block 138 over closest longitudinally-displaced pedestal 141 by a distance "C" of from about 0.28 to about 0.32 microns.

Figure 17:
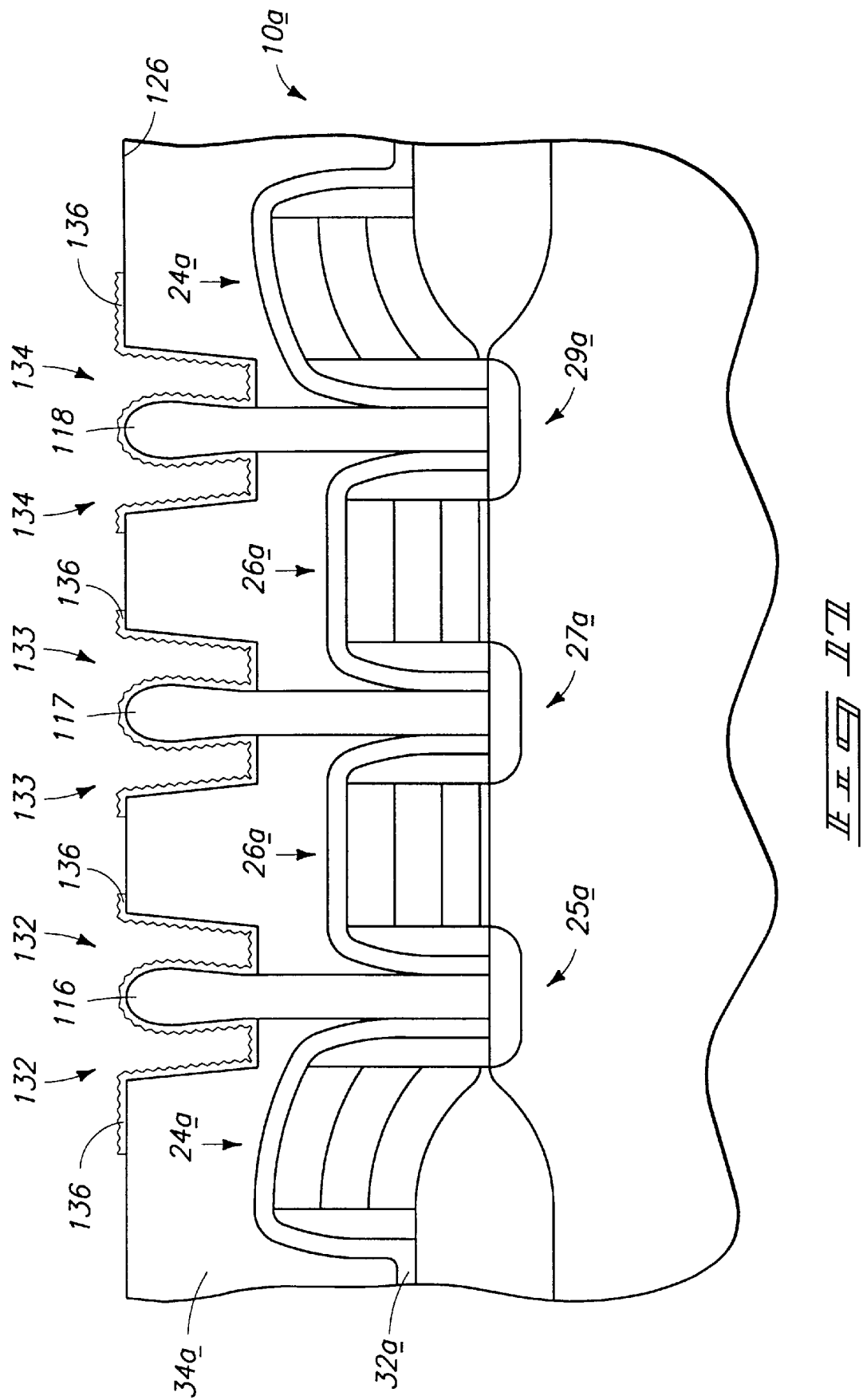
FIG. 17 is a view of the FIG. 2 wafer fragment at a processing step subsequent to that of FIG. 15.

Referring to FIG. 17, patterned masking layer 138 is removed to again expose gaps 132, 133 and 134 adjacent pedestals 116, 117 and 118.

Figure 18:
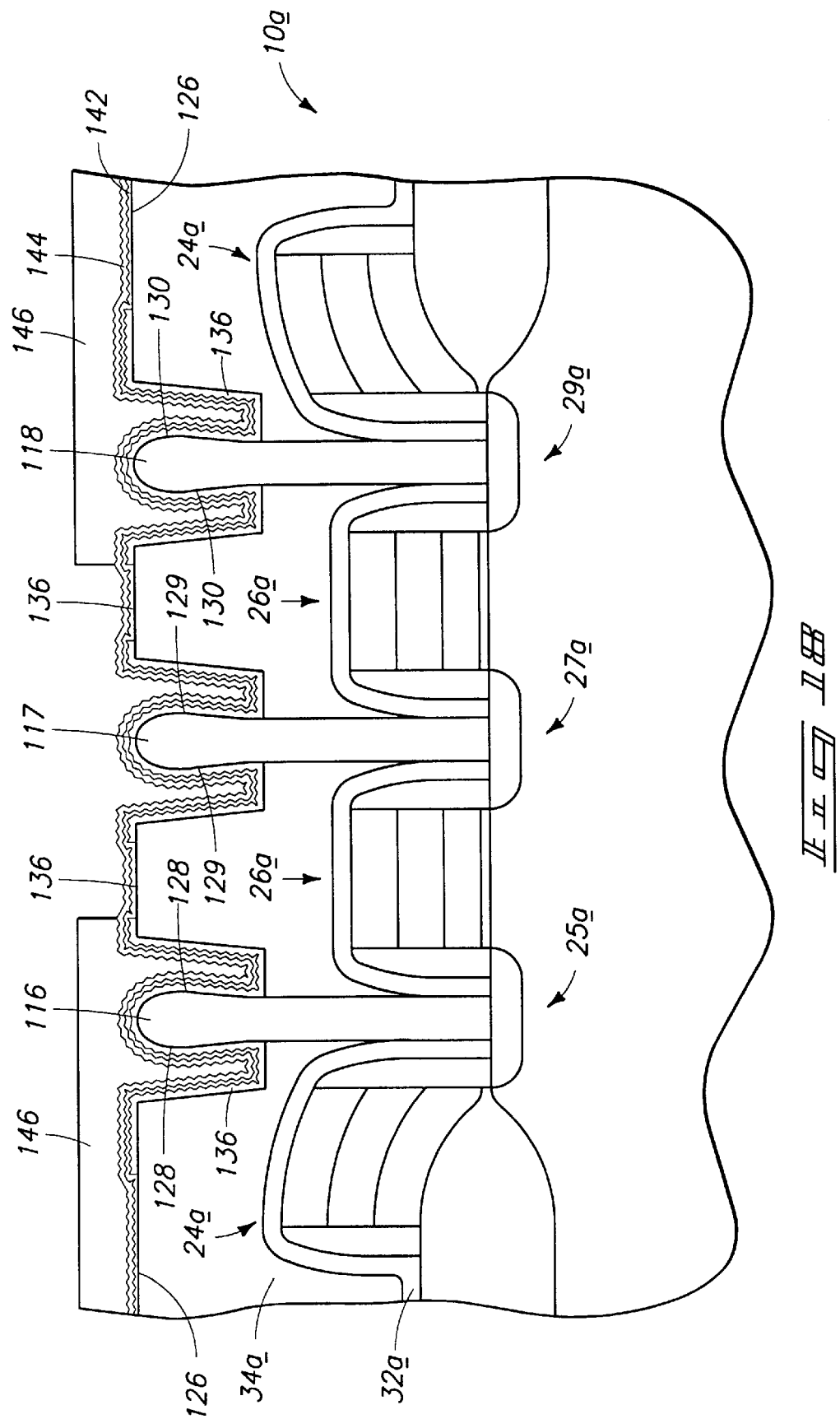
FIG. 18 is a view of the FIG. 2 wafer fragment at a processing step subsequent to that of FIG. 17.

Referring to FIG. 18, a dielectric layer 142 and a cell plate layer 144 are formed adjacent storage node layer 136. The storage node layer 136, dielectric layer 142 and cell plate layer 144 being laterally adjacent the continuous lateral peripheries of pedestals 116, 117 and 118, and specifically being laterally adjacent the lateral surfaces 128, 129 and 130 of pedestals 116, 117 and 118. Dielectric layer 142 will typically comprise silicon nitride and/or silicon oxide, although other suitable materials are known to persons of skill in the art. Cell plate layer 144 will typically comprise doped polysilicon, but other suitable materials are known to persons of skill in the art. In the shown preferred embodiment, the surface irregularities of rugged polysilicon layer 136 are transferred to conformal layers 142 and 144.

After formation of layers 142 and 144, a patterned masking layer 146 is provided over pedestals 116, 117 and 118 to leave exposed portions of layers 142 and 144. Patterned masking layer 146 preferably comprises photoresist. The exposed portions of layers 142 and 144 are subsequently removed by etching to form capacitor constructions 150 and 152 (shown in FIG. 19). Capacitor constructions 150 and 152 comprises heights "Z". The capacitance of capacitor constructions 150 and 152 can be increased by increasing heights "Z". Such increasing of heights "Z" can be accomplished, for example, by increasing the depth "Y" (shown in FIG. 8).

Figure 19:
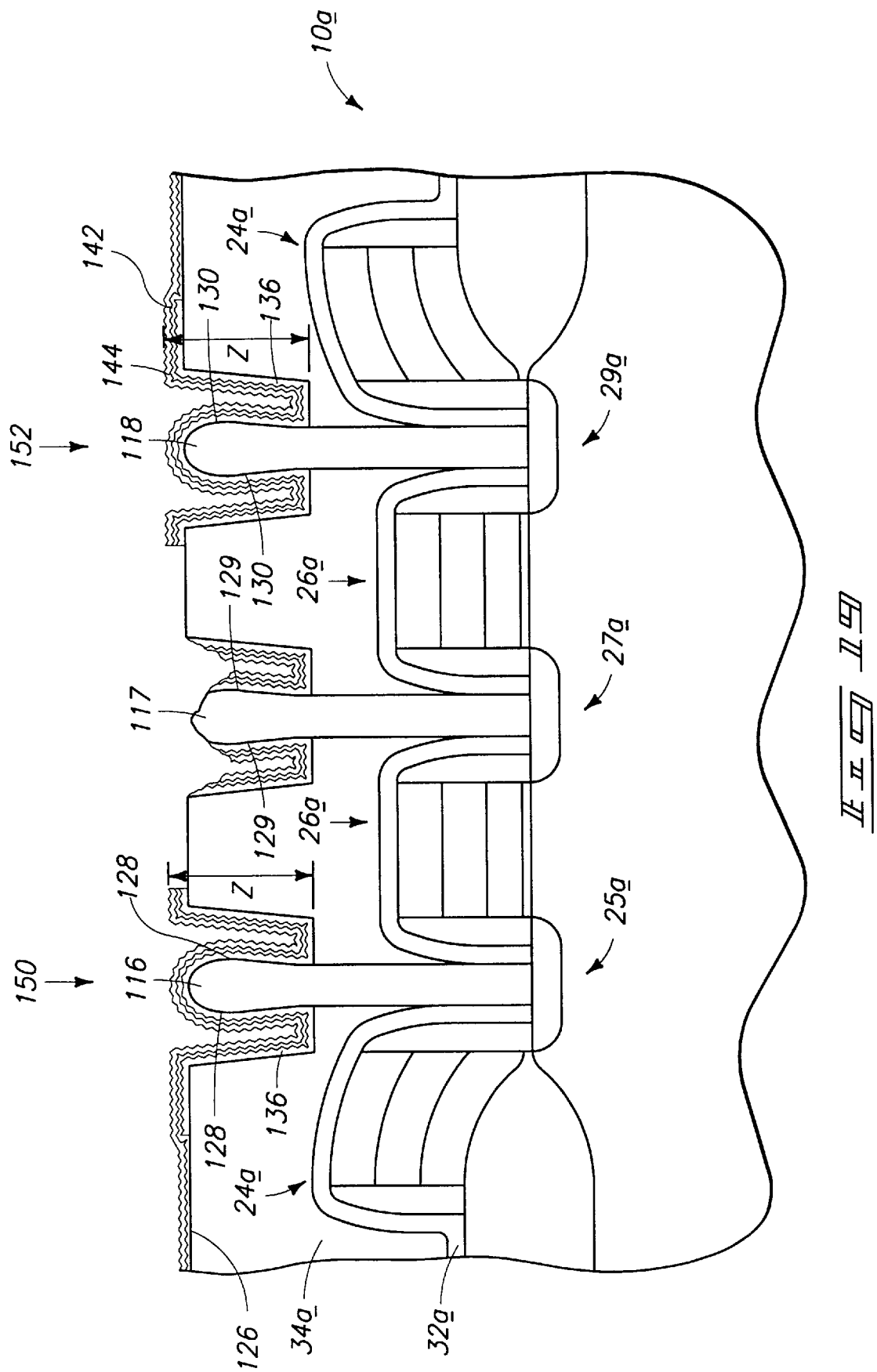
FIG. 19 is a view of the FIG. 2 wafer fragment at a processing step subsequent to that of FIG. 18.

Referring to FIG. 19, photoresist layer 146 is removed, to expose capacitor constructions 150 and 152, comprising pedestals 116 and 118, respectively.

Figure 20:
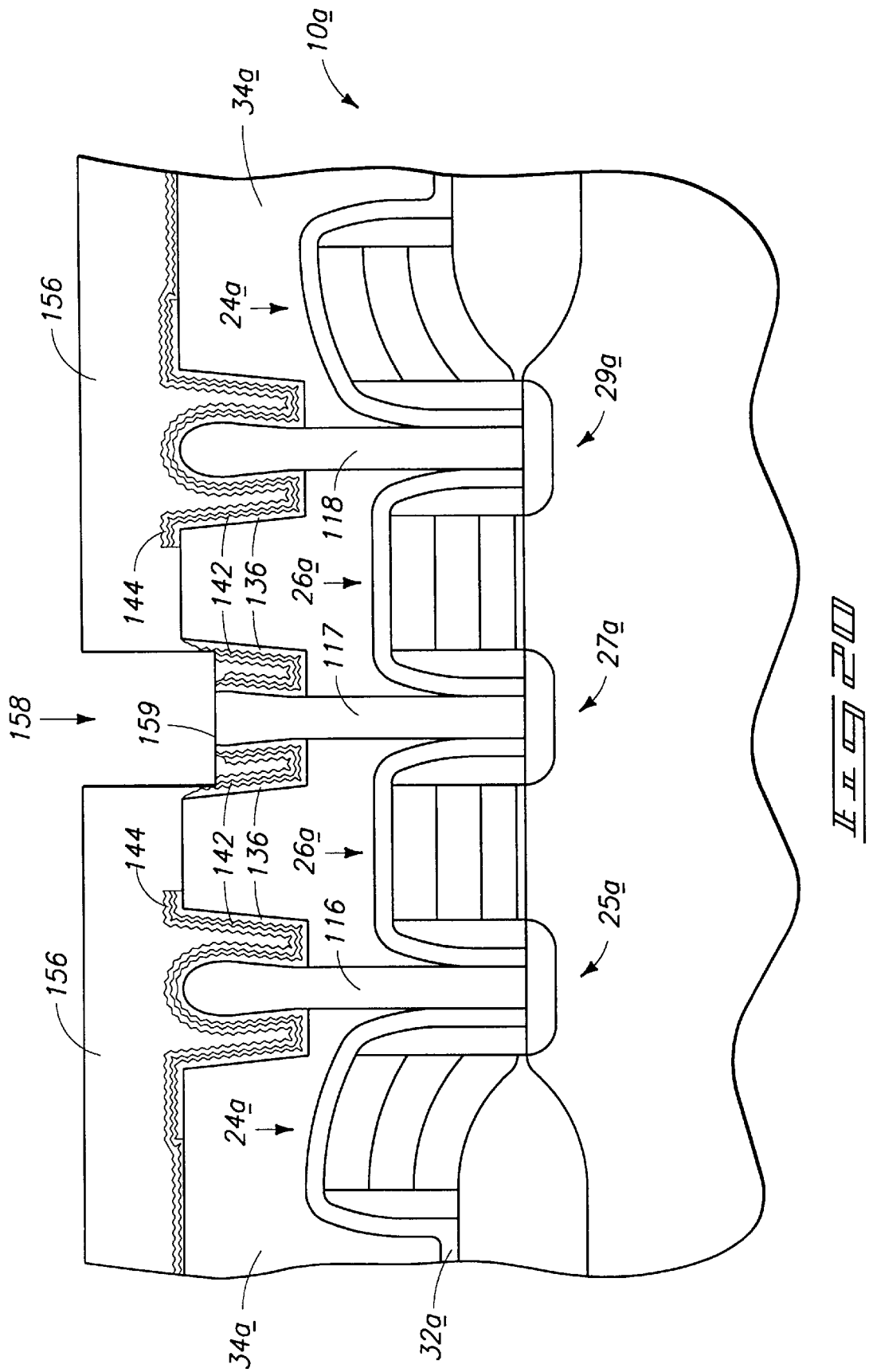
FIG. 20 is a view of the FIG. 2 wafer fragment at a processing step subsequent to that of FIG. 19.

Referring to FIG. 20, an insulative layer 156, preferably comprising BPSG, is provided over pedestals 116, 117 and 118. Subsequently, an opening 158 is etched through insulative layer 156 to pedestal 117. Preferably, as shown, opening 158 removes a portion of pedestal 117 to expose a cross-sectional surface 159 of pedestal 117. Also preferably, opening 158 will extend into layers 136, 142 and 144 within gaps 133 (shown in FIG. 14) adjacent pedestal 117. However, it is noted that opening 158 is provided to expose pedestal 117 for ultimate electrical contact to a bitline, and therefore need not etch pedestal 117.

Figure 21:
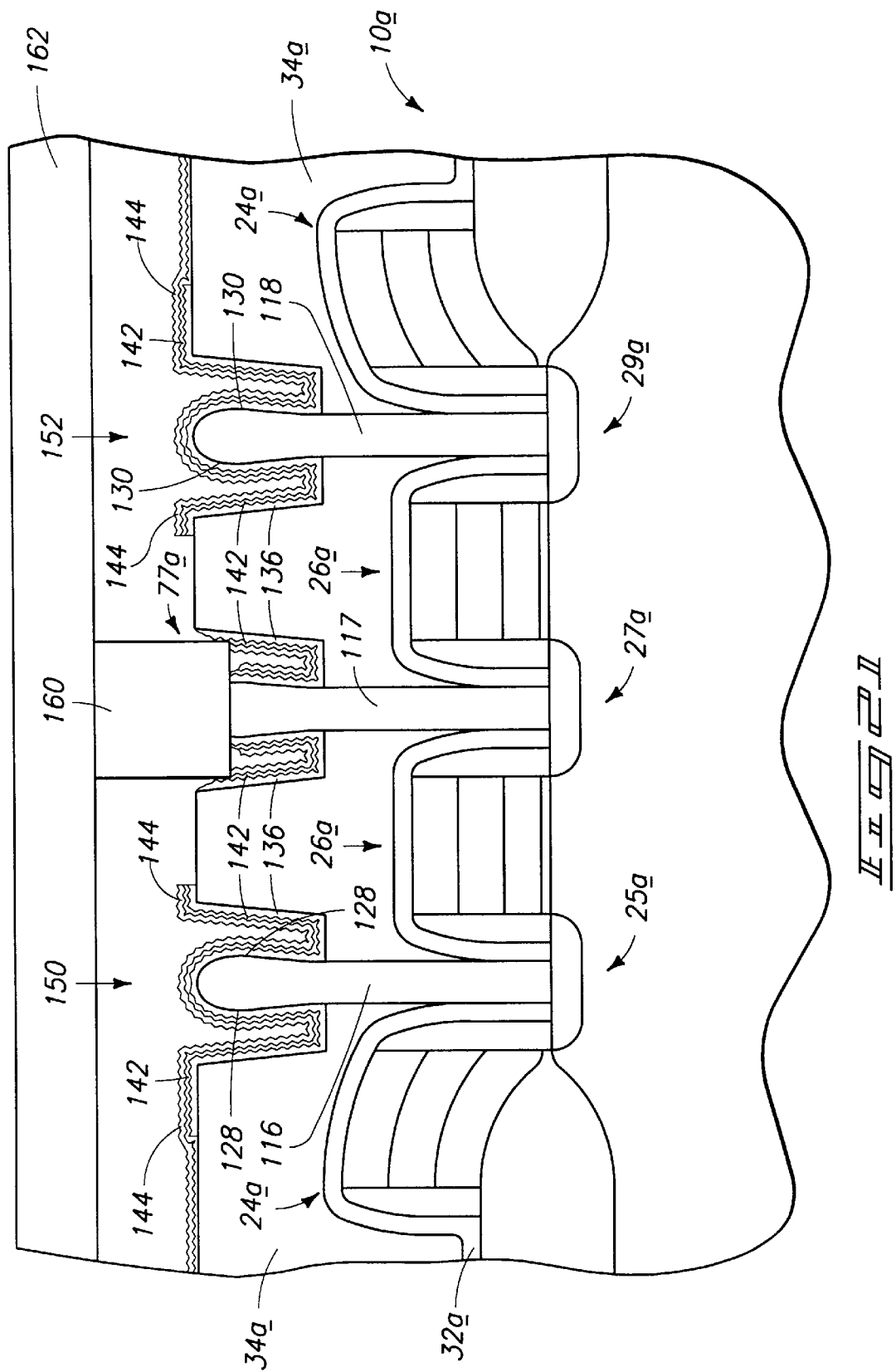
FIG. 21 is a view of the FIG. 2 wafer fragment at a processing step subsequent to that of FIG. 20.
Figure 22:
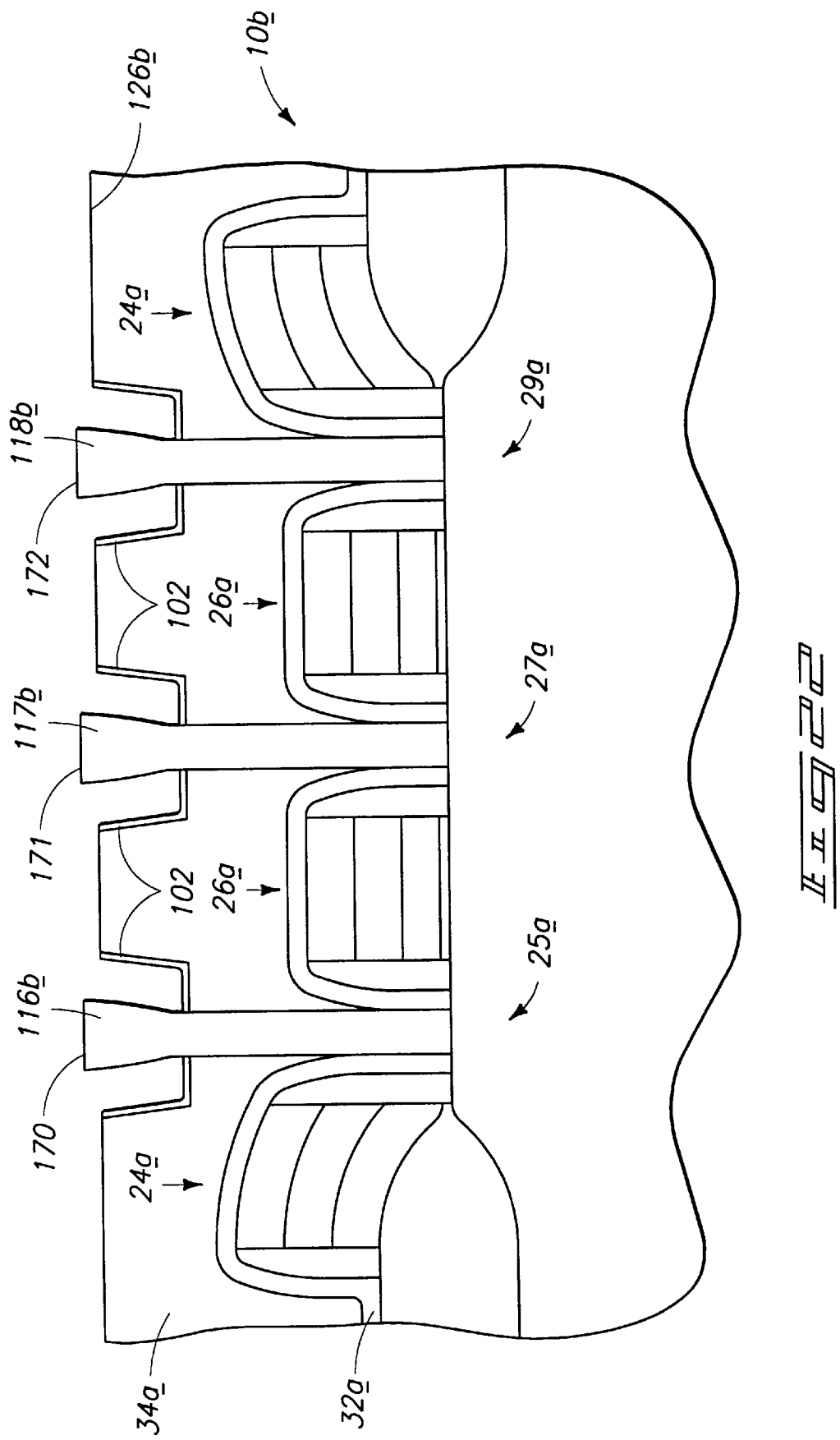
FIG. 22 is a view of the FIG. 2 wafer fragment processed according to a second embodiment of the present invention, shown at a processing step subsequent to that of FIG. 12.

Referring to FIG. 21, a bitline plug 160 is formed within opening 158 (shown in FIG. 20) and in electrical contact with pedestal 117. Methods of forming bitline plug 160 are known to persons of ordinary skill in the art. Also, persons of ordinary skill in the art will recognize that bitline plug 160 could comprise a number of different materials. An example material is tungsten. Such tungsten may be deposited by sputter deposition followed by planarization.

A bitline 162 is formed over bitline plug 160 and in electrical connection with bitline plug 160. Methods for forming bitline 162 are known to persons of ordinary skill in the art. Also known to persons of ordinary skill in the art is that bitline 162 may comprise a number of different materials, including, for instance aluminum. An example method for depositing an aluminum-comprising bitline 162 is sputter deposition.

The structure shown in FIG. 21 comprises a DRAM array including capacitors 150 and 152 electrically connected through transistor gates 26a to pedestal 117, bitline plug 160 and ultimately to bitline 162. The DRAM array of FIG. 21 comprises two DRAM cell structures, with capacitor 150 and a transistor gate 26a configured to form a first DRAM cell structure; and capacitor 152 and a transistor gate 26a configured to form a second DRAM cell structure.

The capacitors, 150 and 152, when viewed in lateral cross-section, comprise electrically conductive pedestals, 116 or 118, with opposing lateral surfaces, 128 or 130. The opposing lateral surfaces are laterally against an inner electrically conductive layer 136. Inner conductive layer 136 is laterally against a capacitor dielectric layer 142, which is laterally adjacent opposing surfaces 128 and 130 of pedestals 116 and 118, respectively. Laterally against capacitor dielectric layer 142 is an outer electrically conductive layer 144. Layer 144, like layer 142, is laterally adjacent opposing surfaces 128 and 130 of pedestals 116 and 118, respectively.

Pedestal 117 and bitline plug 160 together form a bitline contact 77a. Bitline contact 77a further comprises electrically conductive layer 136 laterally against conductive pedestal 117, dielectric layer 142 laterally against electrically conductive layer 136, and outer electrically conductive layer 144 laterally against dielectric layer 142. As shown, bitline plug 160 is above pedestal 117, at least a portion of dielectric layer 142 and at least a portion of conductive layer 136.

A second embodiment method of the present invention is described with reference to FIG. 22. In referring to FIG. 22, like numerals from the preceding discussion of the embodiment of FIGS. 2–21 are utilized where appropriate, with differences being indicated by the suffix "b" or with different numerals. FIG. 22 illustrates a wafer 10b at process step subsequent to the process step of FIG. 12, wherein sacrificial layer 104 (shown in FIG. 12) comprises silicon nitride rather than the polysilicon of the embodiment shown in FIGS. 2–21. Pedestals 116b, 117b and 118b comprise conductively doped polysilicon, is as did pedestals 116, 117 and 118 in the embodiment shown in FIGS. 2–21.

An etch of silicon nitride is typically more selective relative to doped polysilicon than is an etch of undoped polysilicon. Accordingly, pedestals 116b, 117b and 118b are essentially unetched during removal of silicon nitride layer 104. Thus, the pedestals 116b, 117b and 118b of FIG. 22 lack the rounded upper surfaces of the pedestals 116, 117 and 118 in FIG. 13. Instead, pedestals 116b, 116b and 118b generally comprise a flared upper region with flat upper surfaces 170, 171 and 172, respectively. Conditions for removing the silicon nitride selectively relative to doped polysilicon are known to persons of ordinary skill in the art. An example of such conditions is a wet etch utilizing $H_3PO_4$.

In the shown preferred embodiment of forming pedestals 116b, 117b, and 118b, BPSG layer 34a and etch restriction layer 102 are first etched to below the original planarized upper surface 126 (shown in FIG. 12) to form an upper surface 126b below upper surfaces 170, 171, and 172. Such prior etching insures that there will be adequate clearance around the upper corners of pedestals 116b, 116b and 118b for providing subsequent storage node, capacitor dielectric and cell plate layers during further processing, such as processing analogous to that described above with reference to FIGS. 14–21.

After formation of the pedestals 116b, 116b and 118b, subsequent processing to form a bitline over capacitor DRAM structure can be accomplished with procedures analogous to the processing described above with reference to FIGS. 14–21. Persons of ordinary skill in the art can readily accomplish the processing from such above description. Accordingly, further description, specific to the embodiment of FIG. 22, is not provided herein.

The DRAM arrays of the present invention may be incorporated into integrated circuitry, such as microprocessors.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted and in accordance with the doctrine of equivalents.

What is claimed is:

1. A method of forming a capacitor container opening comprising the following steps:

forming an electrically insulative layer over a semiconductive substrate;

patterning a masking layer over a portion of the insulative layer to form an unmasked portion of the insulative layer and a masked portion of the insulative layer; and with the masking layer over the insulative layer, removing parts of the unmasked and masked portions of the insulative layer to form a container opening within the unmasked and masked portions, the opening undercutting the masking layer.

2. The method of claim 1 wherein the step of removing parts of the unmasked and masked portions comprises an anisotropic dry etch followed by an isotropic wet etch.

3. The method of claim 1 wherein the insulative layer comprises BPSG and the masking layer comprises a material selected from the group consisting of polysilicon, silicon nitride, and polyimide.

4. The method of claim 1 wherein the insulative layer comprises BPSG and the masking layer comprises polysilicon.

5. A method of forming a capacitor container opening over a node location comprising the following steps:

forming an electrically insulative layer over a node location; and forming a capacitor container opening in the electrically insulative layer to the node location, the opening comprising a shape of a vertically elongated stem underlying a cap, the cap having a first cross-sectional dimension of less than a minimum-most photolithographic feature dimension used in the method, the stem having a second cross-sectional dimension of less than the first cross-sectional dimension.

6. A method of forming a capacitor comprising the following steps:

forming a layer of electrically insulative material over a semiconductive substrate;

patterning a masking layer over a portion of the insulative layer to form an unmasked portion of the insulative layer and a masked portion of the insulator;

with the masking layer over the insulative layer, removing parts of the unmasked and masked portions of the insulative layer to form a container opening within the unmasked and masked portions, the opening undercutting the masking layer;

forming a sacrificial layer within the container opening;

forming an electrically conductive pedestal within the container opening and laterally against the sacrificial layer;

removing the sacrificial layer to form a gap along a lateral surface of the conductive pedestal, the gap being between the conductive pedestal and the insulative material;

forming a storage node layer within the gap and against the lateral surface of the conductive pedestal;

forming a dielectric layer operatively proximate the storage node layer; and forming a cell plate layer operative proximate the dielectric layer; the cell plate layer, dielectric layer and storage node layer being together configured to form a capacitor.

7. The method of claim 6 wherein the step of forming the storage node layer comprises:

providing the storage node layer within the gap, over the conductive pedestal and over the insulative material; and patterning the storage node layer.

8. The method of claim 6 wherein the step of forming the storage node layer comprises:

providing the storage node layer within the gap, over the conductive pedestal and over the insulative material;

forming a patterned masking layer over the storage node layer to form masked and unmasked portions of the storage node layer; and removing the unmasked portions of the storage node layer to pattern the storage node layer.

9. The method of claim 6 wherein the step of forming the storage node layer comprises:

providing the storage node layer within the gap, over the conductive pedestal and over the insulative material; and polishing the storage node layer to pattern the storage node layer.

10. A method of forming a capacitor comprising the following steps:

forming a layer of electrically insulative material over a semiconductive substrate;

forming an electrically conductive pedestal extending into the layer of electrically insulative material, the pedestal in lateral cross-section comprising a pair of opposing lateral surfaces;

forming a first gap between one of the opposing lateral surfaces of the conductive pedestal and the insulative material, and forming a second gap between the other opposing lateral surface and the insulative material;

forming a storage node layer within both the first and second gaps;

forming a dielectric layer within both the first and second gaps; and forming a cell layer within both the first and second gaps; the dielectric layer, cell layer and storage node layer being together configured to form a capacitor.

11. A method of forming a capacitor comprising the following steps:

forming a layer of electrically insulative material over a semiconductive substrate;

forming an electrically conductive pedestal extending into the layer of electrically insulative material;

forming a gap between a portion of the conductive pedestal and the insulative material to expose a portion of the conductive pedestal and to leave a portion to the conductive pedestal unexposed, the gap extending entirely around a lateral periphery of said exposed portion of the conductive pedestal; and forming a storage node layer within the gap;

forming a dielectric layer within the gap; and forming a cell layer within the gap; the dielectric layer, cell layer and storage node layer being together configured to form a capacitor.

12. A method of forming a capacitor and bitline construction comprising the following steps:

defining a first node location and a second node location of a substrate;

forming a first electrically insulative layer over the node locations;

patterning a masking layer over a portion of the first insulative layer to form an unmasked portion and a masked portion of the first insulative layer;

removing parts of the masked and unmasked portions of the first insulative layer to form a first opening over the first node location and a second opening over the second node location, the first and second openings underlying part of the masking layer and not extending to the first and second node locations;

forming a sacrificial spacer layer within the first and second openings and over the masking layer;

removing parts of the sacrificial spacer layer and the first insulative layer to form a third opening extending from the first opening to the first node location and a fourth opening extending from the second opening to the second node location, and to form remaining portions of the sacrificial spacer layer;

forming a first electrically conductive pedestal within the first and third openings and in electrical connection with the first node location;

forming a second electrically conductive pedestal within the second and fourth openings and in electrical connection with the second node location;

removing at least some of the remaining portions of the sacrificial spacer layer to form a first gap between the first conductive pedestal and the insulative layer and a second gap between the second conductive pedestal and the insulative layer;

forming a conductive layer within the first and second gaps, the conductive layer in the first gap being a storage node layer;

forming a dielectric layer operatively proximate the storage node layer;

forming a cell plate layer operatively proximate the dielectric layer; the cell plate layer, dielectric layer and storage node layer being together configured to form a capacitor electrically connected to the first pedestal; and forming an electrically conductive bitline plug electrically connected to the second pedestal.

13. The method of claim 12 wherein the dielectric layer and cell layer are formed within the first and second gaps.

14. The method of claim 12 further comprising:

after forming the dielectric layer, cell layer and storage node layer, forming a second electrically insulative layer over the first insulative layer and over the first and second pedestals; and before forming the conductive bitline plug, removing a portion of the second insulative layer to expose the second pedestal for electrical connection to the conductive bitline plug.

15. The method of claim 12 further comprising:

after forming the dielectric layer, cell layer and storage node layer, forming a second electrically insulative layer over the first insulative layer and over the first and second pedestals; and before forming the conductive bitline plug, removing a portion of the second insulative layer to expose the second pedestal and removing a portion of the exposed second pedestal.

16. The method of claim 12 wherein the dielectric layer and cell layer are formed within the first and second gaps, and further comprising:

after forming the dielectric layer, cell layer and storage node layer, forming a second electrically insulative layer over the first insulative layer, the first and second pedestals, the dielectric layer, cell layer and conductive layer;

before forming the conductive bitline plug, 1) removing a portion of the second insulative layer to expose the dielectric layer, cell layer and conductive layer within the second gap and to expose the second pedestal; and 2) removing portions of the exposed second pedestal, exposed dielectric layer, exposed cell layer and exposed conductive layer; and wherein the conductive bitline plug contacts the dielectric layer, cell layer and conductive layer within the second gap.

17. The method of claim 12 wherein the dielectric layer and cell layer are formed within the first and second gaps and further comprising, prior to formation of the conductive plug, removing: 1) portions of the dielectric layer, cell layer and conductive layer within the second gap; and 2) a portion of the second pedestal.

18. The method of claim 12 further comprising incorporating the capacitor and bitline construction into a DRAM cell by providing a transistor gate between the first and second node locations to electrically couple the node locations.

19. A method of forming a DRAM array comprising the following steps:

defining a first node location, a second node location and a third node location of a substrate; the second node location being electrically coupled to the first node location through a first transistor gate and being electrically coupled to the third node location through a second transistor gate;

forming a first electrically insulative layer over the node locations;

patterning a masking layer over a portion of the first insulative layer to form an unmasked portion and a masked portion of the first insulative layer;

removing parts of the masked and unmasked portions of the first insulative layer to form a first opening over the first node location, a second opening over the second node location, and a third opening over the third node location; the first, second and third openings undercutting the masking layer and not extending to the first, second and third node locations;

forming a sacrificial spacer layer within the first, second and third openings and over the masking layer;

removing parts of the sacrificial spacer layer and the first insulative layer to form a fourth opening extending from the first opening to the first node location, a fifth opening extending from the second opening to the second node location, a sixth opening extending from the third opening to the third node location, and to form remaining portions of the sacrificial spacer layer;

forming a first electrically conductive pedestal within the first and fourth openings and in electrical connection with the first node location;

forming a second electrically conductive pedestal within the second and fifth openings and in electrical connection with the second node location;

forming a third electrically conductive pedestal within the third and sixth openings and in electrical connection with the third node location;

removing at least some of the remaining portions of the sacrificial spacer layer to form a first gap between the first conductive pedestal and the insulative layer, a second gap between the second conductive pedestal and the insulative layer, and a third gap between the third conductive pedestal and the insulative layer;

forming a storage node layer within the first, second and third gaps;

forming a dielectric layer within the first, second and third gaps;

forming a cell layer within the first, second and third gaps;

the storage node layer, cell layer, and dielectric layer within the first gap together forming a first capacitor;

the storage node layer, cell layer, and dielectric layer within the third gap together forming a second capacitor;

forming an electrically conductive bitline plug electrically connected to the second pedestal;

forming a bitline over the first and second capacitors and electrically connected to the second pedestal through the bitline plug;

the second pedestal and first capacitor together forming a first DRAM cell electrically connected to the bitline; and the second pedestal and second capacitor together forming a second DRAM cell electrically connected to the bitline.

20. A method of forming a monolithic integrated circuit comprising the following steps:

fabricating integrated circuitry over a portion of a semiconductor substrate, the integrated circuitry comprising transistors, capacitors and resistive elements;

the fabrication of at least one of the capacitors comprising the following steps:

forming a layer of electrically insulative material over a semiconductive substrate;

patterning a masking layer over a portion of the insulative layer to form an unmasked portion of the insulative layer and a masked portion of the insulator;

with the masking layer over the insulative layer, removing parts of the unmasked and masked portions of the insulative layer to form a container opening within the unmasked and masked portions, the opening undercutting the masking layer;

forming a sacrificial layer within the container opening;

forming an electrically conductive pedestal within the container opening and laterally against the sacrificial layer;

removing the sacrificial layer to form a gap along a lateral surface of the conductive pedestal, the gap being between the conductive pedestal and the insulative material;

forming a storage node layer within the gap and against the lateral surface of the conductive pedestal;

forming a dielectric layer operatively proximate the storage node layer; and forming a cell plate layer operative proximate the dielectric layer; the cell plate layer, dielectric layer and storage node layer being together configured to form the capacitor.

21. The method of claim 20 wherein the integrated circuit is fabricated as part of a microprocessor circuit.

22. The method of claim 20 wherein the integrated circuit is fabricated as part of a microprocessor circuit and wherein the at least one capacitor is incorporated into a DRAM cell.

* * * * *

UNITED STATES PATENT AND TRADEMARK OFFICE
CERTIFICATE OF CORRECTION

PATENT NO.  : 6,140,172

DATED       : October 31, 2000

INVENTOR(S) : Kunal R. Parekh

It is certified that error appears in the above-identified patent and that said Letters Patent is hereby corrected as shown below:

Col. 3, after line 45 under the Heading "DESCRIPTION OF THE PREFERRED EMBODIMENTS" add as the first paragraph --This disclosure of the invention is submitted in furtherance of the constitutional purposes of the U.S. Patent Laws "to promote the progress of science and useful arts" (Article 1, Sec. 8)--

Col. 7, line 24   Delete "24" before the word --shown--

Col. 9, line 47   Delete "is" after the word --polysilicon,--

Col. 9, line 55   Replace the second "116b" with --117b--

Col. 9, line 67   Replace the second "116b" with --117b--

Col 10, line 5    Replace the second "116b" with --117b--

Signed and Sealed this

Twenty-ninth Day of May, 2001

*Attest:*

NICHOLAS P. GODICI

*Attesting Officer*    *Acting Director of the United States Patent and Trademark Office*